(12) United States Patent
Watanabe

(10) Patent No.: US 10,014,335 B2
(45) Date of Patent: Jul. 3, 2018

(54) SOLID-STATE IMAGING DEVICE AND CAMERA MODULE

(71) Applicant: Panasonic Intellectual Property Management Co., Ltd., Osaka (JP)

(72) Inventor: Hisashi Watanabe, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 529 days.

(21) Appl. No.: 14/426,810

(22) PCT Filed: Aug. 14, 2013

(86) PCT No.: PCT/JP2013/004856
§ 371 (c)(1),
(2) Date: Mar. 9, 2015

(87) PCT Pub. No.: WO2014/041742
PCT Pub. Date: Mar. 20, 2014

(65) Prior Publication Data
US 2015/0221691 A1  Aug. 6, 2015

(30) Foreign Application Priority Data

Sep. 14, 2012 (JP) ................. 2012-203141

(51) Int. Cl.
*H04N 5/33* (2006.01)
*H01L 27/146* (2006.01)
(Continued)

(52) U.S. Cl.
CPC ........ *H01L 27/14621* (2013.01); *G01J 3/513* (2013.01); *H01L 27/1462* (2013.01);
(Continued)

(58) Field of Classification Search
None
See application file for complete search history.

(56) References Cited

U.S. PATENT DOCUMENTS 5,648,653 A  7/1997 Sakamoto et al.
5,929,432 A  7/1999 Yamakawa
(Continued)

FOREIGN PATENT DOCUMENTS

JP  3-71669  3/1991
JP  6-204444  7/1994
(Continued)

OTHER PUBLICATIONS

International Search Report dated Oct. 8, 2013 in International (PCT) Application No. PCT/JP2013/004856.

*Primary Examiner* — Heather Jones
(74) *Attorney, Agent, or Firm* — Wenderoth, Lind & Ponack, L.L.P.

(57) ABSTRACT

A solid-state imaging device includes: a color filter layer which includes filters disposed above light receiving portions of a semiconductor substrate in one-to-one correspondence; and an infrared cut filter layer having an infrared cut wavelength at which transmittance is 50% or less and which ranges from 610 nm to 710 nm, wherein the filters include a visible light transmission filter which transmits visible light, and an infrared transmission filter having an infrared transmission wavelength at which transmittance is 50% or more and which ranges from 590 nm to 690 nm, and the infrared cut filter layer has an opening above one of the light receiving portions above which the infrared transmission filter is disposed, and is disposed above one of the light receiving portions above which the visible light transmission filter is disposed.

10 Claims, 12 Drawing Sheets

(51) Int. Cl.
 *G01J 3/51* (2006.01)
 *H04N 9/04* (2006.01)
(52) U.S. Cl.
 CPC ......... *H01L 27/14627* (2013.01); *H04N 5/33* (2013.01); *H04N 5/332* (2013.01); *H04N 9/045* (2013.01)

(56) References Cited

U.S. PATENT DOCUMENTS

| | | |
|---|---|---|
| 6,953,952 B2 | 10/2005 | Asakawa |
| 7,755,016 B2 | 7/2010 | Toda et al. |
| 8,035,069 B2 | 10/2011 | Toda et al. |
| 8,138,466 B2 | 3/2012 | Hosaka |
| 8,446,499 B2 | 5/2013 | Kamiyama |
| 8,519,319 B2 | 8/2013 | Toda et al. |
| 8,848,047 B2 | 9/2014 | Inuiya et al. |
| 2003/0016290 A1 | 1/2003 | Kwon |
| 2004/0211884 A1 | 10/2004 | Fang et al. |
| 2006/0186322 A1 | 8/2006 | Matsuyama |
| 2007/0201738 A1 | 8/2007 | Toda et al. |
| 2007/0272836 A1 | 11/2007 | Higashitsutsumi et al. |
| 2008/0079806 A1 | 4/2008 | Inuiya et al. |
| 2008/0283729 A1 | 11/2008 | Hosaka |
| 2010/0038543 A1 | 2/2010 | Toda et al. |
| 2011/0085043 A1 | 4/2011 | Kamiyama |
| 2011/0235017 A1* | 9/2011 | Iwasaki ................ H04N 5/2354 356/4.01 |
| 2012/0001072 A1 | 1/2012 | Toda et al. |
| 2014/0009662 A1 | 1/2014 | Toda et al. |

FOREIGN PATENT DOCUMENTS

| | | |
|---|---|---|
| JP | 7-170366 | 7/1995 |
| JP | 10-65135 | 3/1998 |
| JP | 2002-182270 | 6/2002 |
| JP | 2003-58874 | 2/2003 |
| JP | 2004-327998 | 11/2004 |
| JP | 2006-237737 | 9/2006 |
| JP | 2007-53731 | 3/2007 |
| JP | 2007-189376 | 7/2007 |
| JP | 2007-192713 | 8/2007 |
| JP | 2007192713 A * | 8/2007 |
| JP | 2007-242878 | 9/2007 |
| JP | 2007242878 A * | 9/2007 |
| JP | 2007-311447 | 11/2007 |
| JP | 2008-5213 | 1/2008 |
| JP | 2008-085160 | 4/2008 |
| JP | 2008-288629 | 11/2008 |
| JP | 2010-22700 | 2/2010 |
| JP | 2010-212306 | 9/2010 |
| JP | 2010212306 A * | 9/2010 |
| JP | 2011-082859 | 4/2011 |
| JP | 2011-199798 | 10/2011 |

* cited by examiner

Film configuration: Nine-layered structure of
4 TiO2 layers and 5 SiO2 layers

Transmittance of infrared cut filter

: Pixel above which IR cut filter is disposed

☐ Pixel above which IR cut filter is disposed

|  | 6 layers | 8 layers | 10 layers |
|---|---|---|---|
| $TiO_2$ | 9 | 71 | 72 |
| $SiO_2$ | 170 | 144 | 147 |
| $TiO_2$ | 68 | 65 | 70 |
| $SiO_2$ | 144 | 144 | 162 |
| $TiO_2$ | 66 | 65 | 92 |
| $SiO_2$ | 60 | 150 | 22 |
| $TiO_2$ |  | 75 | 94 |
| $SiO_2$ |  | 83 | 169 |
| $TiO_2$ |  |  | 83 |
| $SiO_2$ |  |  | 96 |

SOLID-STATE IMAGING DEVICE AND CAMERA MODULE

TECHNICAL FIELD

The present invention relates to a solid-state imaging device and a camera module.

BACKGROUND ART

Generally, it is necessary to provide an infrared cut filter on an optical path in order to capture a color image using a camera (camera module) which includes a solid-state imaging device (image sensor). For example, Patent Literature (PTL) 1 discloses a camera module which includes a solid-state imaging device and an infrared cut filter. The reason for using an infrared cut filter is that a color filter conventionally used functions, in a visible light range, as a color filter which transmits only light of three primary colors, namely, blue, green, and red, but allows near-infrared light to pass through due to insufficient capability of blocking light in a near-infrared range, as shown in FIG. 2. Near-infrared light to which the human eye is not sensitive is sensed in a wavelength range up to 1100 nm on a silicon substrate used for a solid-state imaging device. Accordingly, without an infrared cut filter, near-infrared signals are mixed into red, green, and blue signals due to the influence of infrared light, resulting in a picture having an unnatural tone.

There is, however, a demand for obtaining a near-infrared image since near-infrared light includes a great amount of information. Examples of usages of a near-infrared image include monitoring and inspection of foodstuffs, agricultural products, chemicals, and paper money, for instance. Although an infrared-light-only solid-state imaging device is often used for such usages, there is a great demand for obtaining a near-infrared light image simultaneously with a visible light image. This is for achieving a reduction in the size and price of a device, and convenience of the device. In order to meet such a demand, in addition to conventional red, green, and blue pixels, a solid-state imaging device has been manufactured in which a near-infrared filter which transmits only near-infrared light (the filter may be referred to as a black filter due to blockage of light in a visible light range) is formed above light receiving portions. However, such a solid-state imaging device has a problem as already described that infrared light enters red, green, and blue pixels, which prevents obtaining a normal color image.

In order to solve this problem, a method for forming an infrared cut filter only above red, green, and blue pixels has been proposed. In PTL 2, a color filter made of an organic color material equivalent to that of a typical color filter is used, which is not specifically and clearly indicated as an infrared cut filter. In contrast, an interference filter made of an inorganic multilayer film is used as an infrared cut filter in PTLs 3 and 4. PTLs 2 and 3 fail to disclose in detail optical characteristics of an infrared filter and an infrared cut filter. PTL 4 does not require severe restrictions on optical characteristics of a filter, and clearly indicates that an infrared cut filter has a characteristic of blocking near-infrared light having a wavelength of about 600 nm to 800 nm or more, and an infrared transmission filter has a characteristic of transmitting near-infrared light having a wavelength of 750 nm or more.

CITATION LIST

Patent Literature

[PTL 1] Japanese Unexamined Patent Application Publication No. 2002-182270

[PTL 2] Japanese Unexamined Patent Application Publication No. H10-65135

[PTL 3] Japanese Unexamined Patent Application Publication No. 2007-189376

[PTL 4] Japanese Unexamined Patent Application Publication No. 2007-53731

SUMMARY OF INVENTION

Technical Problem

Improvement in performance of devices such as a digital camera and a mobile phone has been expanding a demand for functions that such devices do not conventionally have, resulting in a need for a single solid-state imaging device capable of taking not only a beautiful visible light picture, but also a near-infrared light picture, and imaging visible light to near-infrared light, simultaneously.

However, a conventional solid-state imaging device which can simultaneously image visible light and near-infrared light has difficulty in capturing a beautiful and natural visible light picture due to the influence of near-infrared light. The inventors have found, through their detailed study, a need to accurately control optical characteristics of an infrared transmission filter and an infrared cut filter which are to be formed according to sensitivity of the human eye, in order to capture a beautiful and natural color image (visible light picture) under the existence of near-infrared light.

An object of the present invention is to provide a solid-state imaging device and a camera module applicable to various inspections, which can measure a visible-light spectrum and a near-infrared spectrum independently, while the solid-state imaging device and the camera module can simultaneously image visible light and near-infrared light, and take a beautiful and natural visible light picture.

Solution to Problem

In order to achieve the above object, a solid-state imaging device according to an aspect of the present invention includes: a substrate having light receiving portions; a color filter layer which includes filters disposed above the light receiving portions in one-to-one correspondence; and an infrared cut filter layer having an infrared cut wavelength at which transmittance is 50% or less and which ranges from 610 nm to 710 nm, wherein the filters include a visible light transmission filter which transmits visible light, and an infrared transmission filter having an infrared transmission wavelength at which transmittance is 50% or more and which ranges from 590 nm to 690 nm, and the infrared cut filter layer is disposed above one of the light receiving portions above which the visible light transmission filter is disposed, and has an opening above one of the light receiving portions above which the infrared transmission filter is disposed.

Here, the light receiving portions may include four light receiving portions adjacently arranged in a 2×2 matrix, and the color filter layer may include, above the four light receiving portions, four of the filters which are the infrared transmission filter, and three of the visible light transmission filters including a red color filter, a green color filter, and a blue color filter.

The light receiving portions may include eight light receiving portions adjacently arranged in a 4×2 matrix, the eight light receiving portions may include two sets of four light receiving portions adjacently arranged in a 2×2 matrix, the color filter layer may include, above each of the two sets of the four light receiving portions, four of the filters which are the infrared transmission filter, and three of the visible light transmission filters, and the infrared transmission filters above the two sets of the four light receiving portions included in the eight light receiving portions may have different infrared light transmittance characteristics.

The infrared transmission filter may include a color filter material which contains a purple pigment and a yellow pigment as main components.

The infrared cut filter layer may include a multilayer film which is a stack of a layer which includes a silicon oxide film and a layer which includes a titanium oxide film.

The infrared cut filter layer may include a multilayer film which is a stack of a layer which includes a silicon oxide film and a layer which includes a silicon-rich silicon nitride film.

A solid-state imaging device according to an aspect of the present invention includes: a substrate having light receiving portions; a color filter layer which includes visible light transmission filters which are disposed above two or more of the light receiving portions in one-to-one correspondence, and transmit visible light; an infrared cut filter layer disposed above the two or more of the light receiving portions above which the visible light transmission filters are disposed, and having an infrared cut wavelength at which transmittance is 50% or less and which ranges from 610 nm to 710 nm; and an ultraviolet light cut filter layer which is disposed over the light receiving portions, and blocks ultraviolet light.

Here, the ultraviolet light cut filter layer may include a silicon nitride film having a thickness of 0.5 µm or more.

The light receiving portions may include four light receiving portions adjacently arranged in a 2×2 matrix, above the four light receiving portions, the color filter layer may include: four of the visible light transmission filters which are a cyan color filter, a yellow color filter, a green color filter, and a white color filter; or three of the visible light transmission filters which are a cyan color filter, a yellow color filter, and a white color filter, and the infrared cut filter layer may have an opening above one of the light receiving portions above which the white color filter is disposed.

A camera module according to an aspect of the present invention includes the solid-state imaging device.

Here, the camera module may further include a lighting device which emits infrared light simultaneously with visible light.

The solid-state imaging device may include a signal processing circuit which obtains, through the light receiving portions, at least one of: a set which includes a red signal, a green signal, a blue signal, and an infrared signal; a set which includes a red signal, a green signal, a blue signal, and an infrared-containing white signal; a set which includes a cyan signal, a yellow signal, a green signal, and an infrared-containing white signal; a set which includes a cyan signal, a yellow signal, and an infrared-containing white signal; or a set which includes a red signal, a green signal, a blue signal, a first infrared signal, and a second infrared signal, and converts the obtained at least one set into a set which includes a red signal, a green signal, and a blue signal.

The camera module may further include a signal processing circuit which receives, from the solid-state imaging device, at least one of: a set which includes a red signal, a green signal, a blue signal, and an infrared signal; a set which includes a red signal, a green signal, a blue signal, and an infrared-containing white signal; a set which includes a cyan signal, a yellow signal, a green signal, and an infrared-containing white signal; a set which includes a cyan signal, a yellow signal, and an infrared-containing white signal; or a set which includes a red signal, a green signal, a blue signal, a first infrared signal, and a second infrared signal, and converts the received at least one set into a set which includes a red signal, a green signal, and a blue signal.

Advantageous Effects of Invention

According to the present invention, an infrared cut filter and an infrared transmission filter according to sensitivity of the human eye are formed inside a solid-state imaging device. Thus, the solid-state imaging device can simultaneously image visible light and near-infrared light, and take a beautiful and natural visible light picture. In addition, a visible-light spectrum and a near-infrared spectrum can be measured separately, thus achieving a solid-state imaging device applicable to various usages in addition to taking various types of pictures.

DESCRIPTION OF EMBODIMENTS

Figure 1A:
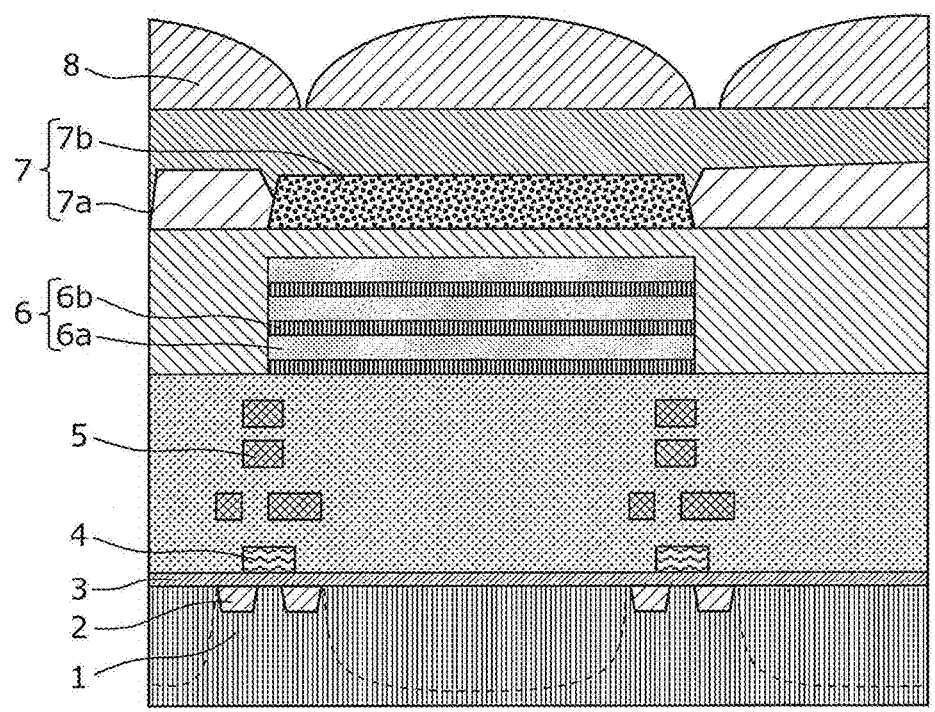
FIG. 1A is a cross-sectional view illustrating a schematic structure of a solid-state imaging device according to a first embodiment.

The following describes embodiments with reference to the drawings. It should be noted that the exemplary embodiments described below each show a preferable, specific example. The numerical values, shapes, materials, constituent elements, the arrangement and connection of the constituent elements, steps, the processing order of the steps, and the like described in the following embodiments are mere examples, and thus are not intended to limit the present invention. The present invention is defined only by the scope of the claims. Thus, although a constituent element which is included in the constituent elements in the embodiments below and is not described in independent claims each showing the broadest concept of the present invention is not necessarily needed in order to achieve the object of the present invention, such a constituent element will be described for a description of a more preferred configuration. In the drawings, elements representing substantially the same configurations, operations, and effects are given the same reference numerals.

A solid-state imaging device according to an embodiment of the present invention includes a substrate having light receiving portions, a color filter layer which includes filters periodically formed above the light receiving portions, and an infrared cut filter layer formed so as to cover a portion of the color filter layer. The infrared cut filter layer and the color filter layer are formed so as to cover some of the light receiving portions in accordance with a regular plane pattern.

Here, the light receiving portions are disposed in a matrix, and the infrared cut filter layer and the color filter layer may have a repeated pattern formed by repeatedly disposing a unit pattern that covers three of the four light receiving portions disposed in a 2×2 matrix.

Furthermore, the infrared cut filter layer and the color filter layer may have a repeated pattern formed by repeatedly disposing a unit pattern that covers repeated three light receiving portions in each of 2×2 matrices among eight light receiving portions disposed in a 4×2 matrix in which two remaining light receiving portions are different light receiving portions.

The infrared cut filter layer may be a multilayer film which is a stack of a layer which includes SiO and a layer which includes SiN or $TiO_2$.

The infrared cut filter layer may be a multilayer film which includes a stack of a layer which includes SiO and a layer which includes TiO.

The infrared cut filter layer may have features that a light blocking wavelength of a infrared cut filter (infrared cut wavelength) and a transmission wavelength of an infrared transmission filter (infrared transmission wavelength) overlap at almost the same wavelength.

According to this aspect, an infrared cut filter and an infrared transmission filter in accordance with sensitivity of the human eye are formed in the solid-state imaging device, and thus visible light and near infrared light can be simultaneously imaged, and a beautiful and natural visible light picture can be taken. Further, red, green, and blue spectra and a near-infrared spectrum can be measured independently, and thus a solid-state imaging device can be achieved which can not only take various pictures, but also is applicable to various usages.

In addition, the solid-state imaging device includes the infrared cut filter layer which blocks infrared rays. Thus, a camera module (camera system) or an electronic device in which a solid-state imaging device is provided does not need to include another filter for blocking infrared rays, and thus the size and cost of the camera module can be reduced.

The following describes details.

[First Embodiment]

Figure 1B:
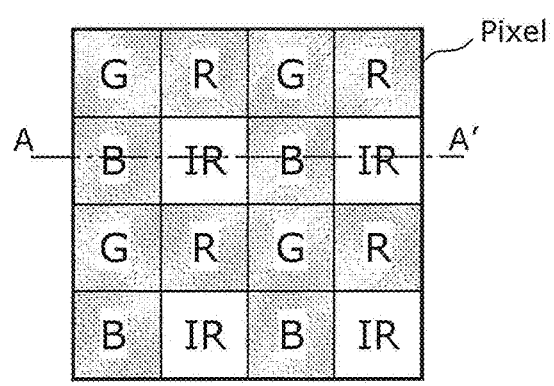
FIG. 1B is a plan view illustrating arrangement of pixels of the solid-state imaging device according to the first embodiment.
Figure 1B:

FIG. 1A is a cross-sectional view illustrating a schematic structure of a solid-state imaging device according to a first embodiment, and FIG. 1B is a plan view illustrating the layout of pixels (arrangement of color filters) of the solid-state imaging device according to the first embodiment. It should be noted that FIG. 1A illustrates a cross-sectional view taken along a portion of the dashed dotted line (line A-A') of FIG. 1B. In addition, the rectangles illustrated in FIG. 1B represent regions corresponding to pixels. The symbols "R", "G", and "B" indicate pixels which detect red, green, and blue light, respectively, and the symbol "IR" indicates a pixel which detects infrared rays (in particular, near-infrared rays). In the following, in order to simplify the description, pixels which detect red, green, and blue light are referred to as a red pixel, a green pixel, and a blue pixel, respectively, and a pixel which detects infrared rays is referred to as an infrared pixel.

The arrangement of color filters as illustrated in FIG. 1B can be achieved by replacing, with an infrared pixel, one of the green pixels in each set of a Bayer array widely used for a solid-state imaging device. A method for manufacturing a solid-state imaging device is as common as a typical method for manufacturing a solid-state imaging device, except for the process of forming an infrared cut filter (in particular, a near-infrared cut filter) and an infrared transmission filter (in particular, a near-infrared transmission filter), and thus a detailed description thereof is omitted here. A detailed description is given of a method for forming an infrared cut filter and an infrared transmission filter.

A solid-state imaging device includes wiring layers 5, an infrared cut filter layer 6, a color filter layer 7, and a plurality of micro lenses 8, above a semiconductor substrate 1 having a surface above which an insulating film 3, gates 4, and element isolation 2 which are constituents of a plurality of pixels are formed. The pixels formed at the semiconductor substrate 1 each include a light receiving portion (a light receiving element, a photodiode) which photoelectrically converts incident light, and a read circuit for reading a signal outputted from the light receiving portion. The semiconductor substrate 1 has a plurality of light receiving portions (pixels) on the surface, and the pixels are formed so as to be arranged in a matrix when the surface of the semiconductor substrate 1 is viewed from above.

The infrared cut filter layer 6 is formed above the wiring layers 5 and under the color filter layer 7, so as to cover pixels other than infrared pixels above which infrared transmission filters 7a are formed, or specifically, so as to cover blue pixels above which blue color filters 7b are formed, green pixels above which green color filters are formed, and red pixels above which red color filters are formed. The color filter layer 7 is formed so as to cover the surface of the infrared cut filter layer 6. It should be noted that the details of the configuration of the infrared cut filter layer 6 are described below.

The color filter layer 7 includes a plurality of filters formed above light receiving portions in one-to-one correspondence. The filters include visible light transmission filters which transmit visible light, and the infrared transmission filters 7a having an infrared transmission wavelength of 650 nm at which transmittance is 50%. The plurality of light receiving portions include four light receiving portions adjacently arranged in a 2×2 matrix. The color filter layer 7 above the four light receiving portions include four filters which are one infrared transmission filter 7a and three visible light transmission filters, namely a red color filter (not illustrated), a green color filter (not illustrated), and the blue color filter 7b.

Specifically, the color filter layer 7 made of organic material include four types of color filters having different spectral characteristics, or specifically, the infrared transmission filter 7a, the blue color filter 7b which is a visible light transmission filter, a green color filter, and a red color filter, in order to extract light of four colors, namely, infrared (IR), blue (B), red (R), and green (G). The color filters can be formed in a pattern by a lithography process.

The color filter layer 7 includes four types of color filters arranged so as to cover pixels one by one in accordance with the pattern as illustrated in FIG. 1B in plan view. In other words, the four types of color filters are formed and cover pixels in one-to-one correspondence. A photosensitive organic color filter resist used for an imaging device (camera module) which includes a typical solid-state imaging device can be used for filters in the color filter layer 7 other than the infrared transmission filters 7a, namely the red color filters, the green color filters, and the blue color filters 7b. Here, a photosensitive organic color filter resist is a resist which includes a pigment as a color material and has sensitivity to ultraviolet rays.

Figure 2:
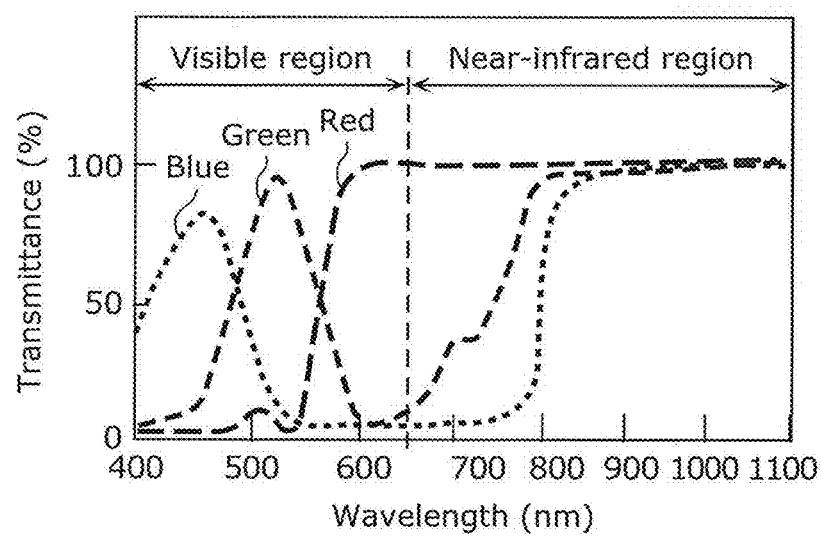
FIG. 2 illustrates transmittance characteristics of a typical color filter.

Typical red and green color filters and the blue color filter 7b have transmittance characteristics as illustrated in FIG. 2, and transmit infrared light. FIG. 2 illustrates transmittance characteristics of typical color filters. In order to prevent influence of this infrared light, it is necessary to dispose the above-mentioned infrared cut filter layer 6 above red, green, and blue pixels. In contrast, the infrared transmission filter 7a, however, needs to have spectral characteristics different from a color filter conventionally and typically used. Although details will be described below, the optical characteristics of the infrared transmission filter 7a need to cause the wavelength at which transmittance is 50% to be about 650 nm, and need to transmit infrared light having a wavelength of about 650 nm or higher at transmittance of 50% or more, in order to achieve a natural tone in accordance with sensitivity of the human eye.

Figure 3:
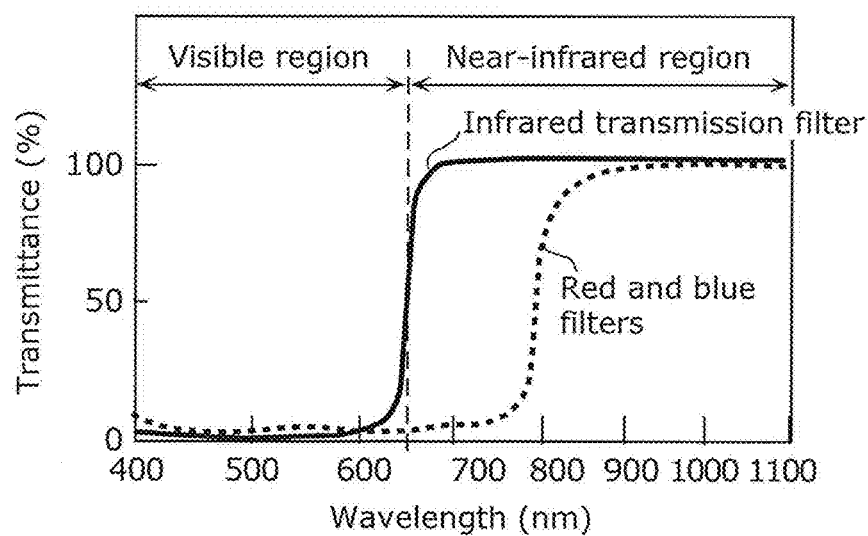
FIG. 3 illustrates transmittance characteristics of an infrared transmission filter according to the first embodiment and a typical infrared transmission filter.

FIG. 3 illustrates transmittance characteristics of an infrared transmission filter according to the first embodiment and a typical infrared transmission filter.

It should be noted that in a typical solid-state imaging device, a blue color filter and a red color filter are stacked to form an infrared transmission filter. In that case, however, as shown by the dotted line in FIG. 3, an infrared transmission wavelength at which transmittance is 50% is about 800 nm, and thus greatly deviates from a boundary between a visible region (visible light) and a near-infrared region (infrared light). Furthermore, in yet another typical solid-state imaging device, optical characteristics according to which an infrared transmission wavelength at which transmittance is 50% ranges from about 750 nm to 800 nm are indicated as optical characteristics of an infrared transmission filter. Even with the characteristics, the wavelength at which transmittance is 50% deviates from the boundary between a visible region and a near-infrared region.

This is based on a fact that a phthalocyanine blue pigment (C.I. Pigment Blue 15:6) is conventionally used to absorb visible light at long wavelengths. The absorption wavelength of this material widely ranges from 550 nm to 800 nm, and thus the infrared transmission wavelength at which transmittance is 50% is about 800 nm. There is a need to acquire a new infrared transmission filter in order to further increase transmittance in an infrared region.

In the present embodiment, the infrared transmission filter 7a includes a new color filter material containing the following pigments as main components, C.I. Pigment Violet 23 (Dioxazine) and C.I. Pigment Yellow 139 (Isoindoline). The use of this material sets the infrared transmission wavelength at which transmittance is 50% to about 650 nm as indicated by the solid line in FIG. 3, and allows the optical characteristics of the infrared transmission filter 7a to be in accordance with the boundary of the sensitivity of the human eye. It is extremely important to increase sensitivity to infrared light that the infrared transmission wavelength of the infrared transmission filter 7a is close to a boundary position between a visual region and a near-infrared region.

As a new color filter material of the infrared transmission filter 7a, a material can be used which has photosensitivity and includes an acrylic resin as base polymer, a multifunctional acrylic monomer, a photo polymerization initiator, a sensitizer, and a solvent, other than the above-mentioned pigments. This material has light photosensitivity, and thus a pattern can be formed by a typical lithography process.

It should be noted that although Pigment Violet 23 as a purple pigment and Pigment Yellow 139 as a yellow pigment are used in the present embodiment, pigments are not particularly limited to these pigments. As a purple pigment, Pigment Violet 19 or 37 can be used, for instance. As a yellow pigment, Pigment Yellow 83, 138, 150, or 185 can also be used, for instance.

After examining various pigments, the inventors have selected Pigment Violet 23 and Pigment Yellow 139 by making comparison of optical characteristics, stability as a color filter, and the performance as a resist. In particular, Pigment Violet 23 has a strong, steep absorption peak in a wavelength range of 500 nm to 650 nm, and thus is optimal material to achieve 50% transmittance at a wavelength of about 650 nm.

The infrared cut filter layer 6 has an infrared cut wavelength of 650 nm at which transmittance is 50%, and is formed above a light receiving portion (pixel) above which a visible light transmission filter is formed, so as to cover the light receiving portion (pixel), and has an opening above a light receiving portion (pixel) above which the infrared transmission filter 7a is formed. The infrared cut filter layer 6 is configured to transmit infrared light having an infrared cut wavelength or higher at transmittance of 50% or less.

The infrared cut filter layer 6 has a multilayer film structure which includes an inorganic multilayer film which is a stack of low refractive index layers 6a each including an inorganic low refractive index material, and high refractive index layers 6b each including an inorganic high refractive index material, the low refractive index layers 6a and the high refractive index layers 6b being alternately layered. For example, the low refractive index layer 6a includes a silicon oxide ($SiO_2$) film, and the high refractive index layer 6b includes a titanium oxide (TiO) film. It should be noted that the high refractive index layer 6b may include SiN instead of TiO. In other words, the infrared cut filter layer 6 may include a multilayer film which is a stack of the low refractive index layer 6a which includes a silicon oxide film, and the high refractive index layer 6b which includes a silicon-rich silicon nitride film. A reactive sputtering method can be used to form the films. Films can be efficiently deposited and stacked in a consecutive manner by using a mufti-chamber reactive sputtering device.

Figure 4A:
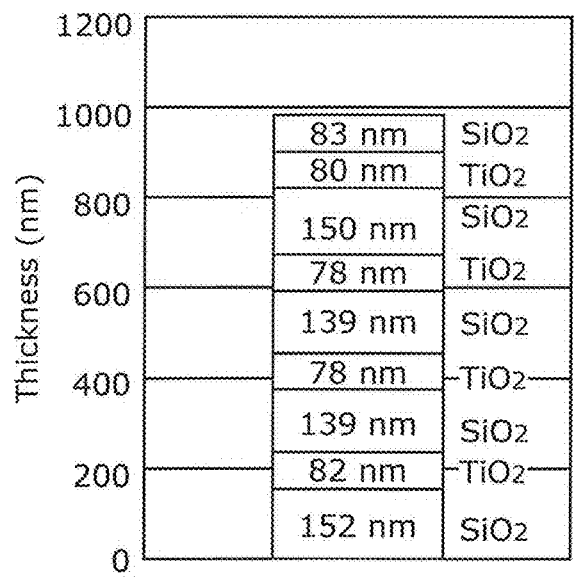
FIG. 4A illustrates an example of a configuration of an infrared cut filter layer according to the first embodiment.
Figure 4B:
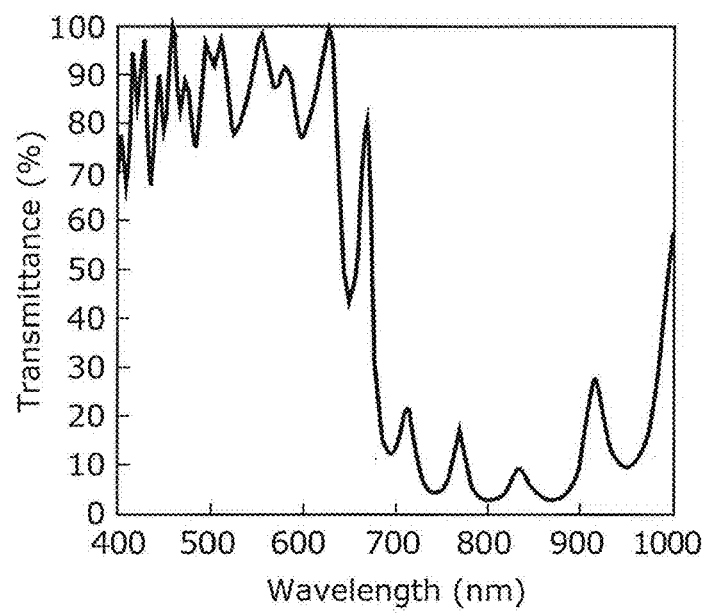
FIG. 4B illustrates examples of transmittance characteristics of the infrared cut filter layer according to the first embodiment.

FIG. 4A illustrates a configuration of an example of an infrared cut filter layer according to the first embodiment. FIG. 4B illustrates examples of transmittance characteristics of an infrared cut filter layer according to the first embodiment. Specifically, FIG. 4A illustrates an example of the infrared cut filter layer 6 illustrated in FIG. 1A, and FIG. 4B illustrates transmittance characteristics (transmittance distributions) of the infrared cut filter layer 6 when the infrared cut filter layer 6 has a multilayer film structure having eight layers.

In the infrared cut filter layer 6 in FIG. 4A, the low refractive index layer 6a and the high refractive index layer 6b each have a thickness ranging from 50 nm to 200 nm, as an example. The infrared cut filter layer 6 is designed so that the infrared cut wavelength at which transmittance is 50% is about 650 nm. In FIG. 4B, a transmittance spectrum is wavy due to interference. The transmittance averaged in a range of about 50 nm is designed to be substantially 50% at about 650 nm. The layers included in the infrared cut filter layer 6 are each designed to have a thickness that achieves optimal optical characteristics in accordance with the configuration of the layers and the number of layers.

According to the configuration as illustrated in FIG. 4A, the infrared cut filter layer 6 is formed by alternately stacking the low refractive index layers 6a and the high refractive index layers 6b to make nine layers in total. It should be noted that the number of layers to be stacked may be set as appropriate depending on, for instance, material and optical characteristics of infrared rays required, and if two types of layers are stacked sequentially to form the infrared cut filter layer 6, the number of stacked layers may range from 6 to 12. Although optical characteristics improve with an increase in the number of layers included in the infrared cut filter layer 6, a manufacturing process becomes complicated, and thus a design may be made with the maximum number of layers being limited to 12.

A solid-state imaging device according to the present embodiment has a feature that the infrared cut filter layer 6 formed as a multilayer film which includes an inorganic material is disposed above pixels other than infrared pixels above which the infrared transmission filters 7a are disposed. In a typical camera module, an infrared cut filter is placed above a solid-state imaging device, and thus it is not allowed to select for each pixel whether to dispose an infrared cut filter above the pixel. In contrast, a solid-state imaging device according to the present embodiment, in a process of manufacturing a solid-state imaging device, the infrared cut filter layer 6 is formed between the micro lens 8 and the semiconductor substrate 1, and thus it is possible to control for each pixel whether to dispose an infrared cut filter above the pixel. The color filter layer 7 is formed with an organic material, and thus it is not easy to stack an inorganic material on the surface of an organic material. Thus, it is more preferable to form the infrared cut filter layer 6 under the color filter layer 7, or specifically, between the semiconductor substrate 1 and the color filter layer 7.

Suitable materials of the infrared cut filter layer 6 include SiO, SiN, TiO, SiON, TaO, ZrO, and others typically used in a semiconductor manufacturing process. Further, it is preferable that the infrared cut filter layer 6 has a multilayer film structure, in order to separate infrared rays.

The plurality of micro lenses 8 are formed on the surface of the color filter layer 7, in one-to-one correspondence with the light receiving portions (pixels). The micro lenses 8 are disposed to each efficiently condense incident light to a corresponding light receiving portion.

Figure 5:
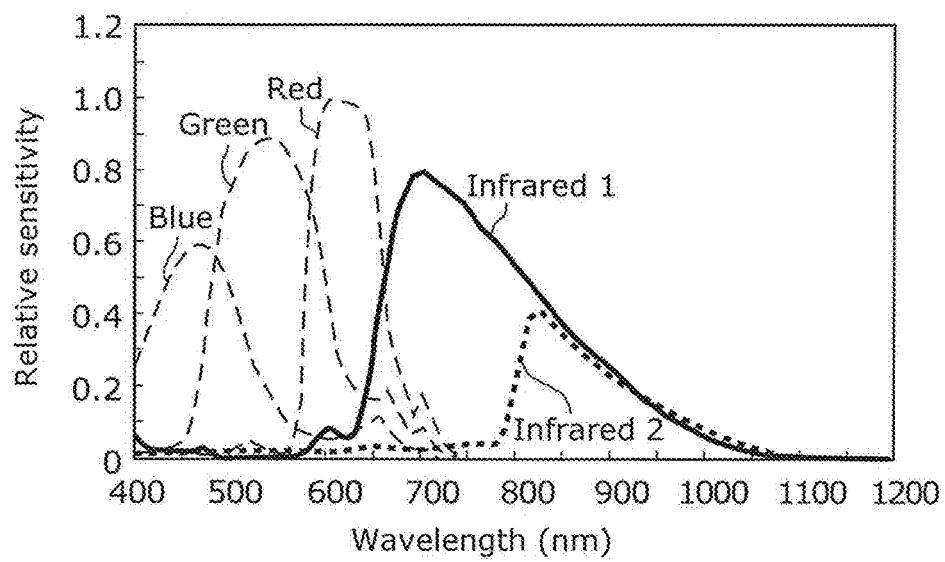
FIG. 5 illustrates spectral sensitivity characteristics of the solid-state imaging device according to the first embodiment.

FIG. 5 illustrates spectral sensitivity characteristics of the solid-state imaging device according to the first embodiment. A solid-state imaging device which includes the infrared transmission filter (solid line of FIG. 3) 7a having novelty according to the present embodiment, and a solid-state imaging device for comparison which includes an infrared transmission filter having a stack of red and blue color filters (dotted line in FIG. 3) are manufactured for trial. FIG. 5 illustrates a comparison between spectral sensitivity characteristics (spectral sensitivity curves) obtained by the above devices. It should be noted that in FIG. 5, a thick solid line (infrared 1 in FIG. 5) indicates spectral sensitivity of an infrared pixel when the infrared transmission filter 7a according to the present embodiment is used, whereas a dotted line (infrared 2 in FIG. 5) indicates spectral sensitivity of an infrared pixel when an infrared transmission filter having a stack of red and blue color filters (blue and red stacked filter) is used, in correspondence with FIG. 3. Further, dashed lines indicate spectral sensitivity of visible light pixels, or specifically, a red pixel (red in FIG. 5), a blue pixel (blue in FIG. 5), and a green pixel (green in FIG. 5), when the infrared transmission filters 7a according to the present embodiment are used.

As illustrated in FIG. 5, both the solid-state imaging device according to the present embodiment and the solid-state imaging device for the comparison have almost the same spectral characteristics of visible light pixels. However, compared to the case where the red and blue stacked filter is used, infrared sensitivity increases about three times by using the new infrared transmission filter 7a according to the present embodiment.

A description is given of the importance of light separation design for the infrared cut filter layer 6 and the infrared transmission filter 7a, with reference to FIG. 5.

First, it is preferable that sensitivity of a visible light pixel corresponds to sensitivity of the human eye, in order to obtain a natural and beautiful image. Accordingly, it is preferable that an infrared cut wavelength at which transmittance of the infrared cut filter layer 6 is 50% is about 650 nm. For the analysis and inspection purposes, blue, green, red, and infrared pixels need to be separate having an appropriate overlap.

If a blue and red stacked filter is used as the infrared cut filter layer 6, an infrared pixel has sensitivity only to a wavelength of 800 nm or more. This results in a dead region in a wavelength region of 650 nm to 800 nm. This is not preferable as a multi-spectrum sensor. As already stated, light having a longer wavelength has lower sensitivity due to light absorption characteristics of silicon. Thus, if the infrared transmission filter 7a having a transmission region at a wavelength of 800 nm or more is used, there is a problem that infrared sensitivity is reduced by about ⅓, compared to the case where the infrared transmission filter having a transmission region at a wavelength of 650 nm or more is used. Accordingly, it is preferable that the infrared cut wavelength of the infrared cut filter layer 6 and the infrared transmission wavelength of the infrared transmission filter 7a (the wavelength at which transmittance is 50%) are almost the same, and are substantially the same as a wavelength of light visible to the human eye. Thus, according to the present embodiment, the infrared cut wavelength (50%) of the infrared cut filter layer 6 and the infrared transmission wavelength (50%) of the infrared transmission filter 7a are designed to be 650 nm.

The solid-state imaging device according to the present embodiment includes the infrared cut filter layer 6, and thus a camera module, for instance, which includes the solid-state imaging device does not need to separately include an infrared cut filter as conventionally required. Thus, the use of the solid-state imaging device according to the present embodiment achieves a slim camera module and a slim electronic device with the imaging function.

The following describes application of the solid-state imaging device according to the present embodiment.

The use of the solid-state imaging device according to the present embodiment allows evaluation of freshness of fruits, vegetables, meat, and others. The following describes an example in which the solid-state imaging device according to the present embodiment is used to determine the freshness of a cucumber.

Figure 6:
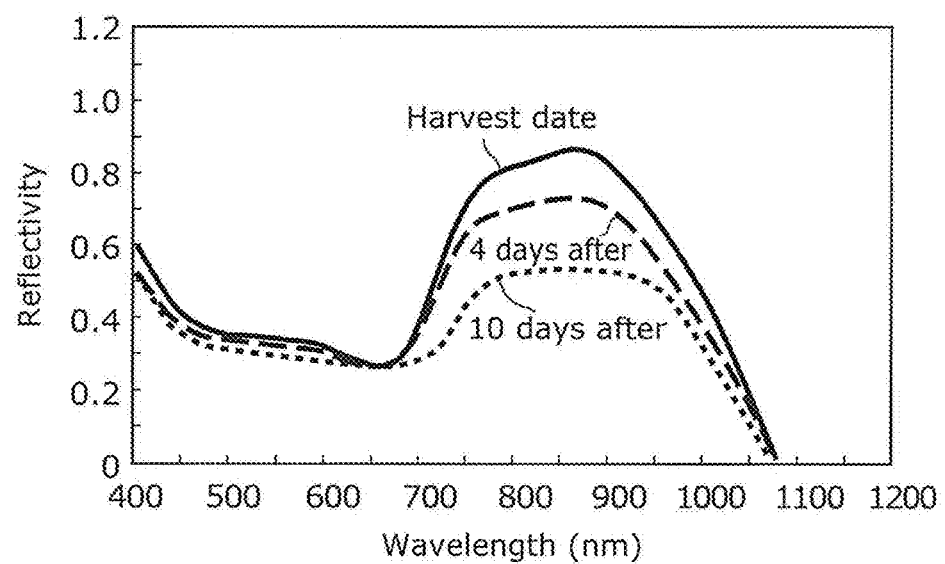
FIG. 6 illustrates reflectance spectra showing a change in cucumber over time, obtained by the solid-state imaging device according to the first embodiment.
Figure 7:
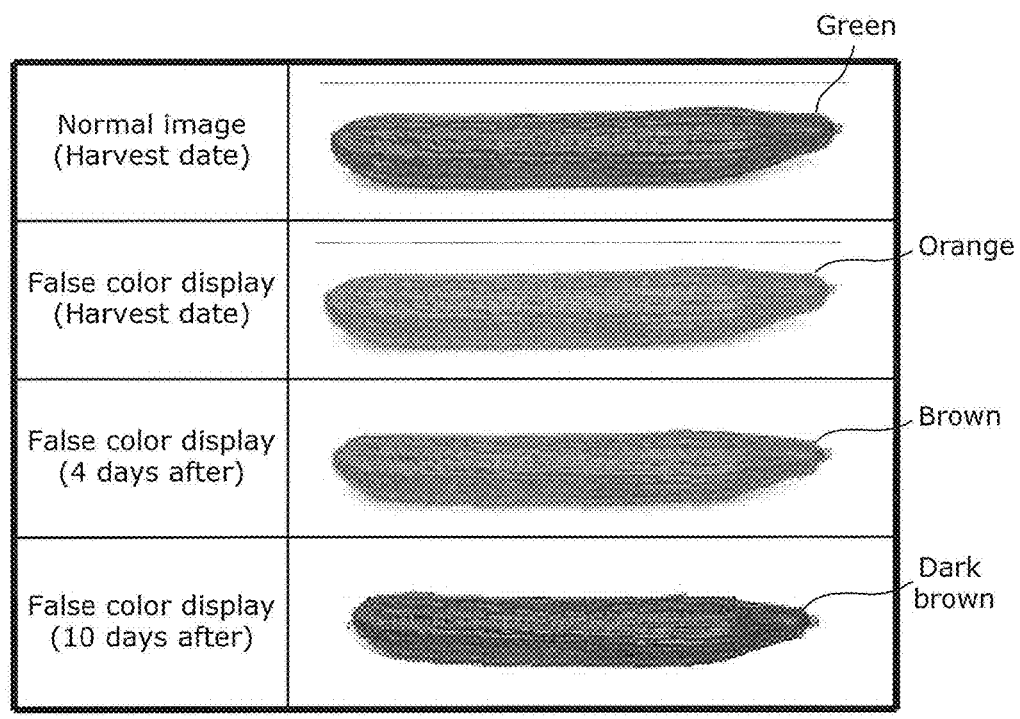
FIG. 7 shows images of a change in cucumber over time, obtained by the solid-state imaging device according to the first embodiment.

FIG. 6 illustrates reflectance spectra showing a change in cucumber over time, obtained by the solid-state imaging device according to the first embodiment. FIG. 7 shows images of a change in cucumber over time, obtained by the solid-state imaging device according to the first embodiment. Specifically, FIG. 6 illustrates reflectance spectra of a cucumber measured using a reflectance measuring device which includes the solid-state imaging device according to the present embodiment, on the harvest date, four days after the harvest date, and ten days after the harvest date. Further, FIG. 7 shows images of a cucumber captured on the harvest date, four days after the harvest date, and ten days after the harvest date, using the solid-state imaging device according to the present embodiment.

FIG. 6 shows that the reflectance of visible light does not greatly change as the days pass from the harvest date, whereas the reflectance spectrum within a long wavelength region outside the red region greatly changes.

A display device displays in RGB, and thus cannot image infrared light (even if there is a display device which can image infrared light, people cannot recognize infrared light). For the measurement in FIG. 7, the false color display normally performed by a multispectral scanner of, for instance, Landsat was adopted in order to image infrared light. This is a technique that allows visual inspection by assigning blue display to a green light band, green display to a red light band, red display to an infrared band, and combines the displays to produce a color image. A cucumber has high reflectivity of infrared light, and thus is displayed in a color close to reddish orange.

FIG. 7 shows that as the days pass from the harvest date, infrared light reflectance falls, and the percentage of a red color of the displayed color falls, which results in a blackish image. The freshness of a cucumber can be evaluated from the colors. In addition, the freshness can be determined from an image, and thus bad parts of fruits and vegetables which are difficult to be found by visual check can be detected. A change in cucumber over time decreases reflection of infrared light caused by reflection of chlorophyll. In false color display, components of infrared light are displayed in red, and thus the color changes from orange to brown, and to dark brown. The false color display allows freshness to be recognized intuitively. Such a rapid decrease in chlorophyll due to the change over time and a fall in reflection of infrared light caused thereby are phenomena that generally happen to plants (vegetables and fruits), and thus the disclosure of this Specification is also applicable to other vegetables and fruits.

Furthermore, the freshness of a cucumber can also be numerically evaluated from the ratio between infrared light signal strength and red signal strength.

Figure 8:
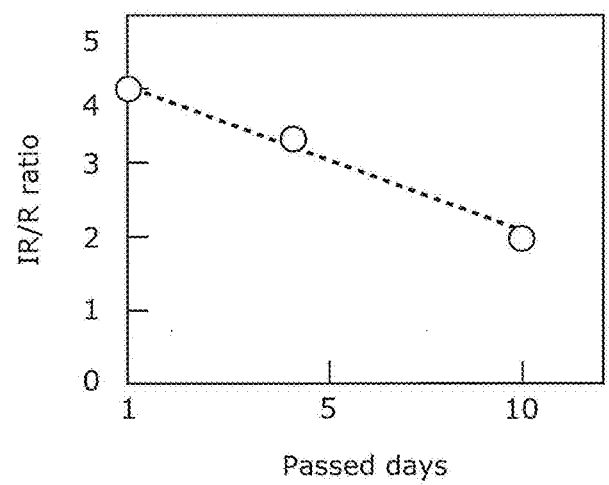
FIG. 8 illustrates a change of freshness parameter calculated from the images of a cucumber obtained by the solid-state imaging device according to the first embodiment.

FIG. 8 illustrates a change of freshness parameter calculated from the images of a cucumber obtained by the solid-state imaging device according to the first embodiment. Specifically, FIG. 8 illustrates ratios between infrared output and red output obtained by capturing images of a cucumber with the solid-state imaging device according to the present embodiment, as the days have passed.

FIG. 8 shows that the freshness of a cucumber can be numerically expressed. In FIG. 8, as a parameter indicating the freshness of a cucumber, a ratio Ksp between an infrared light signal and a red signal is defined as being IR (infrared light signal)/R (red signal). This shows that the freshness can be evaluated based on the numerical values of Ksp.

The use of the solid-state imaging device according to the present embodiment allows a mobile device such as a mobile phone which includes a camera module to evaluate freshness and safety of foodstuffs with ease. If evaluation is performed with a mobile device, selection between photographing and false color display allows evaluation with ease by the naked eye from an image. If numerical evaluation is performed, it is necessary to launch an application program for calculation, and select a subject to be evaluated in an image (a cucumber in this case). Although calculations are different for foodstuffs, it is easy to install an application program into a communicable mobile device, thus allowing a wide range of uses.

It should be noted that in order to further increase the accuracy of evaluation with a solid-state imaging device, it is preferable to capture an image with a strobe light. This is because a spectrum of a light source of a strobe light is known, and thus reflectance can be evaluated with higher accuracy. In addition, it is preferable that a strobe light source used for imaging with the solid-state imaging device according to the present embodiment is configured to emit not only visible light, but infrared light.

A cucumber used for this evaluation originally has a green color, and thus an image in which an infrared signal having a strong intensity is displayed in red seems unnatural. Plants and animals generally have high reflectance for infrared light, and thus what color is used to image infrared light is important. Plants can be displayed in a color similar to a natural color by assigning blue, red, and green to a green band, a red band, and an infrared band, respectively, which is called natural color display.

In an application program, it is possible to select, according to an object to be evaluated (evaluation target), display in a color close to the color of the object. Anyway, infrared light invisible to the human eye is imaged on a visible portion, and thus completely natural display cannot be theoretically presented. However, contrivances can be made such as display with hues close to the actual colors or display which calls attention with ease when cautions are required.

Although an example of evaluating freshness of a cucumber is described here, it has been checked that freshness of other foodstuffs such as fruits, vegetables, meat, and eggs can be evaluated using a reflection spectrum of infrared light. The evaluation using the solid-state imaging device according to the present embodiment is applicable in many usages. Conceivable usages other than food evaluation include determination as to whether paper money is forged and prevention of using a wrong chemical.

This is based on a difficulty of providing a similar reflectance to infrared light even if ink used for printing has a similar reflectance to visible light. In addition, paper money for which infrared ink is adopted has been recently used voluntarily in order to prevent forgery. Thus, it is considered useful that a determination as to whether paper money is forged can be easily made using infrared light.

Checking medicines aims at preventing an accident that a patient who takes many medicines mistakenly takes another medicine, since almost all medicines are white. Although medicines look white with visible light, the medicines often have greatly different reflectances for infrared light. Checking a color by false color display using infrared light reduces the risk of taking an incorrect medicine.

As described above, the solid-state imaging device according to the present embodiment images infrared light by making infrared light visible which is originally invisible to the eye, and thus needs to perform signal processing (color processing) different from processing conventionally performed. The following describes a basic idea of signal processing.

In a typical imaging device (camera module), a red (R) signal, a green (G) signal, and a blue (B) signal from a solid-state imaging device are converted into a red (X) output signal, a green (Y) output signal, and a blue (Z) output signal to a display, using a color conversion matrix shown by Expression 1 below.

[Math 1]

$$\begin{bmatrix} X \\ Y \\ Z \end{bmatrix} = \begin{bmatrix} Rx & Gx & Bx \\ Ry & Gy & By \\ Rz & Gz & Bz \end{bmatrix} \begin{bmatrix} R \\ G \\ B \end{bmatrix} \quad \text{Expression 1}$$

However, signals in the solid-state imaging device according to the present embodiment are signals of four colors, namely, an infrared signal (Ir) in addition to a red signal (R), a green signal (G), and a blue signal (B), whereas signals output to a display are signals of three colors, namely, a red output signal (X), a green output signal (Y), and a blue output signal (Z). Thus, a color conversion matrix for converting signals in the solid-state imaging device into signals output from the solid-state imaging device to the display is a 3×4 color conversion matrix as shown by Expression 2 below.

[Math 2]

$$\begin{bmatrix} X \\ Y \\ Z \end{bmatrix} = \begin{bmatrix} Ix & Rx & Gx & Bx \\ Iy & Ry & Gy & By \\ Iz & Rz & Gz & Bz \end{bmatrix} \begin{bmatrix} Ir \\ R \\ G \\ B \end{bmatrix} \quad \text{Expression 2}$$

Here, an example in which only color signals mainly used are displayed is illustrated, in order to simplify the description of a principle of signal processing. It is not necessary to use an infrared signal (Ir) in order to display an ordinary color picture with a solid-state imaging device according to the present embodiment. Thus, an imaging device outputs, using a color conversion matrix as shown by Expressions 3 below, RGB signals in the solid-state imaging device as a red output signal (X), a green output signal (Y), and a blue output signal (Z), respectively.

[Math 3]

$$\begin{bmatrix} X \\ Y \\ Z \end{bmatrix} = \begin{bmatrix} 0 & 1 & 0 & 0 \\ 0 & 0 & 1 & 0 \\ 0 & 0 & 0 & 1 \end{bmatrix} \begin{bmatrix} Ir \\ R \\ G \\ B \end{bmatrix} \quad \text{Expression 3}$$

As false color display for displaying an infrared signal (Ir) obtained by the solid-state imaging device according to the present embodiment, a color conversion matrix for signal processing of assigning blue display to a green light band, green display to a red light band, and red display to an infrared band is as shown by Expression 4 below. A red output signal (X) is assigned to an infrared signal (Ir), and a blue signal (B) is not used.

[Math 4]

$$\begin{bmatrix} X \\ Y \\ Z \end{bmatrix} = \begin{bmatrix} 1 & 0 & 0 & 0 \\ 0 & 1 & 0 & 0 \\ 0 & 0 & 1 & 0 \end{bmatrix} \begin{bmatrix} Ir \\ R \\ G \\ B \end{bmatrix} \quad \text{Expression 4}$$

As natural color display, if blue, red, and green are assigned to a green light band, a red light band, and an infrared band, respectively, a color conversion matrix is as shown by Expression 5 below.

[Math 5]

$$\begin{bmatrix} X \\ Y \\ Z \end{bmatrix} = \begin{bmatrix} 0 & 1 & 0 & 0 \\ 1 & 0 & 0 & 0 \\ 0 & 0 & 1 & 0 \end{bmatrix} \begin{bmatrix} Ir \\ R \\ G \\ B \end{bmatrix} \quad \text{Expression 5}$$

Here, to achieve simplicity, although the color conversion matrix has elements 0 and 1, elements in a color conversion matrix may be adjusted to values including a negative numerical value, rather than only 0 and 1, in order to express delicate colors or to emphasize a specific wavelength region according to an object to be inspected.

It should be noted that according to signal processing for such color conversion, a signal-processing block (signal processing circuit) is added into a solid-state imaging device, and the solid-state imaging device can convert signals to output signals of three colors, namely, a red output signal (X), a green output signal (Y), and a blue output signal (Z), and output the output signals. Furthermore, the solid-state imaging device may output light reception signals of four colors, namely, a red signal (R), a green signal (G), a blue signal (B), and an infrared signal (Ir), and a semiconductor chip outside the solid-state imaging device may convert the light reception signals into output signals of three colors, namely, a red output signal (X), a green output signal (Y), and a blue output signal (Z). The same basic idea of signal processing as described above also applies to the case where an external chip is used.

As described above, the solid-state imaging device according to the present embodiment is applicable in a quite wide range, and can make different evaluations on different objects to be imaged. Accordingly, the solid-state imaging device according to the present embodiment produces advantageous effects particularly when used in mobile devices in which various application programs can be installed with ease.

[Second Embodiment]

Figure 9A:
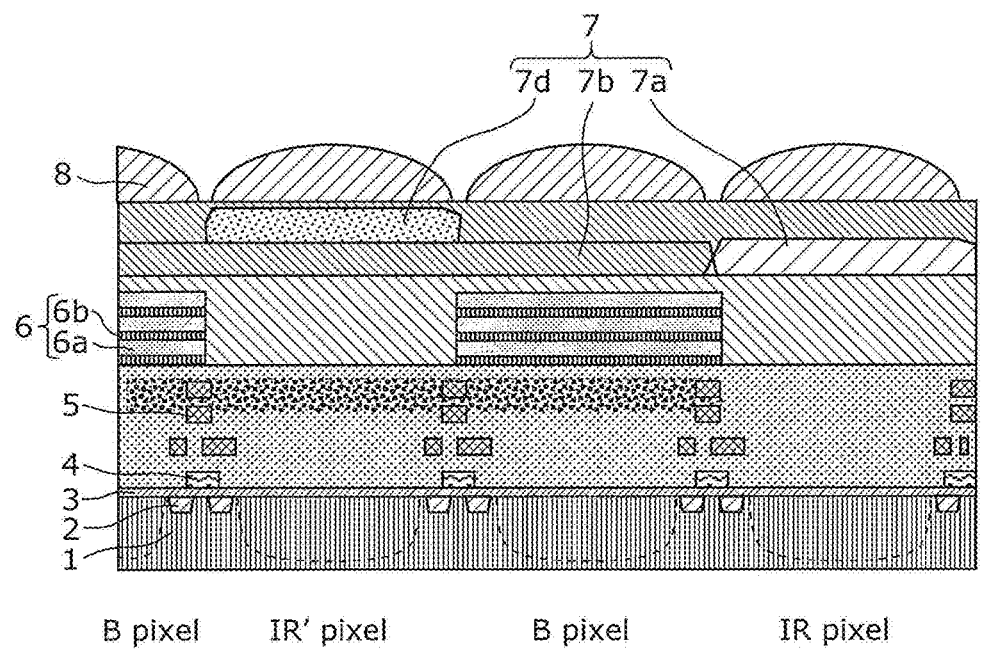
FIG. 9A is a cross-sectional view illustrating a schematic structure of a solid-state imaging device according to a second embodiment.
Figure 9B:
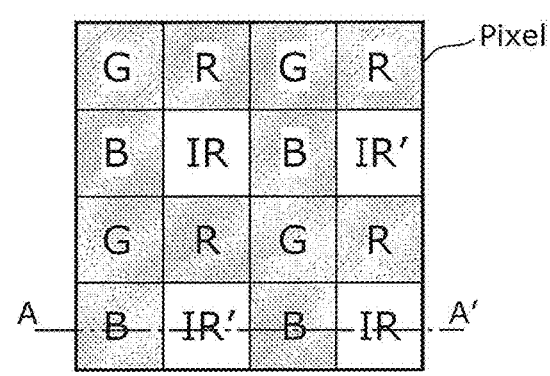
FIG. 9B is a plan view illustrating arrangement of pixels of the solid-state imaging device according to the second embodiment.
Figure 9B:

FIG. 9A is a cross-sectional view illustrating a schematic structure of a solid-state imaging device according to a second embodiment, and FIG. 9B is a plan view illustrating the layout of pixels of the solid-state imaging device according to the second embodiment. It should be noted that FIG. 9A illustrates a cross-sectional view taken along a portion of the dashed dotted line (line A-A') of FIG. 9B. In addition, the rectangles illustrated in FIG. 9B represent regions corresponding to pixels. In addition, in FIG. 9B, the symbols "R", "G", and "B" indicate a red pixel, a green pixel, and a blue pixel, respectively, and the symbols "IR" and "IR'" indicate a first infrared pixel and a second infrared pixel having different spectral characteristics. A basic structure of the solid-state imaging device according to the present embodiment is similar to that according to the first embodiment, and thus the following gives a description focusing on the differences between the first and second embodiments.

The solid-state imaging device according to the present embodiment is the same as the solid-state imaging device according to the first embodiment in that an infrared cut filter layer 6 and a color filter layer 7 are formed above the surface of a semiconductor substrate 1, but different therefrom in that two types of pixels with different spectral sensitivity, namely, a first infrared pixel IR and a second infrared pixel IR' are included.

In the solid-state imaging device according to the present embodiment, a plurality of light receiving portions include eight light receiving portions adjacently arranged in a 4×2 matrix, and include two light receiving portion sets each including four light receiving portions adjacently disposed in a 2×2 matrix. The color filter layer 7 above each of the light receiving portion sets includes four filters which are one infrared transmission filter 7a and three visible light transmission filters, and the two light receiving portion sets which include eight light receiving portions disposed in a 4×2 matrix include the infrared transmission filters 7a having different infrared light transmittance characteristics.

The infrared transmission filter 7a formed above the first infrared pixel IR includes a material similar to that in the first embodiment, and is made of a colored resin composition including C.I. Pigment Violet 23, C.I. Pigment Yellow 139, and C.I. Pigment Red 254. The infrared transmission filter 7a according to the present embodiment is different from the infrared transmission filter 7a according to the first embodiment in that C.I. Pigment Red 254 is added. This aims at further inhibiting transmission of light having a short wavelength of 450 nm or less, and is the same in that the infrared cut wavelength at which transmittance is 50% is 650 nm. As a color filter material of the infrared transmission filter 7a according to the present embodiment, a photosensitive color filter resist can be used which includes a mixture of an acrylic resin as base polymer, a multifunctional acrylic monomer, a photo polymerization initiator, a sensitizer, and a solvent, other than the above-mentioned pigments, which is the same as that of the infrared transmission filter 7a according to the first embodiment. In addition, although Pigment Red 254 is used as a red pigment for the infrared transmission filter 7a according to the present embodiment, the red pigment is not limited to this, and an azo pigment such as Pigment Red 177, 242, and 252 can be used.

Figure 10:
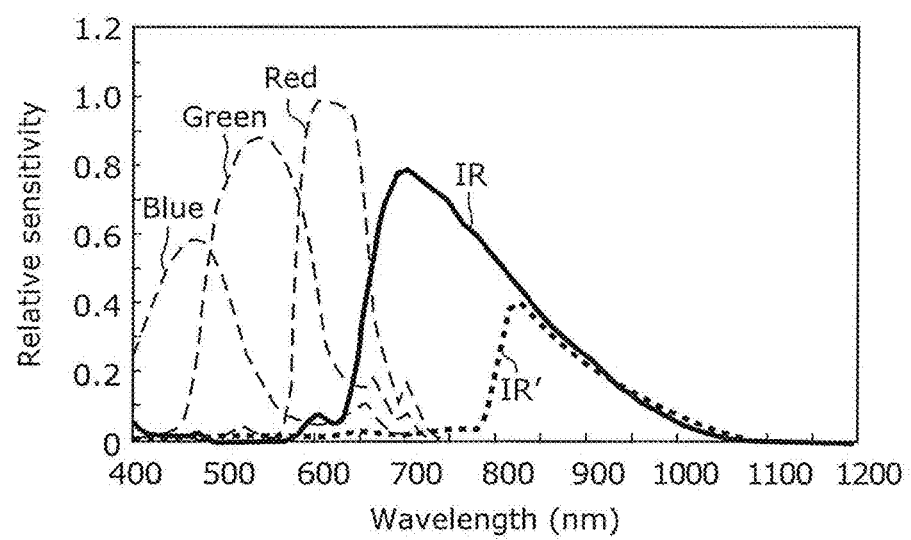
FIG. 10 illustrates spectral sensitivity characteristics of the solid-state imaging device according to the second embodiment.

In the solid-state imaging device according to the present embodiment, the second infrared pixel IR' is added as a new infrared pixel. A color filter above the second infrared pixel IR' has a stack structure of a blue color filter 7b and a red color filter 7d. Such a color filter can be formed by merely changing the mask layout of the red color filter 7d and the blue color filter 7b without having an additional process, since the color filter layer 7 is obtained by forming a green color filter (not illustrated), the blue color filter 7b, the red color filter 7d, and the infrared transmission filter 7a in this order. FIG. 10 illustrates spectral sensitivity characteristics (output spectral waveform) of the solid-state imaging device.

FIG. 10 illustrates characteristics of spectral sensitivity of the solid-state imaging device according to the second embodiment. It should be noted that in FIG. 10, a thick solid line indicates spectral sensitivity of the first infrared pixel IR (IR in FIG. 10), a dotted line indicates spectral sensitivity of the second infrared pixel IR' (IR' in FIG. 10), and dashed lines indicate spectral sensitivity of visible light pixels, or specifically, a red pixel (red in FIG. 10), a blue pixel (blue in FIG. 10), and a green pixel (green in FIG. 10).

Signals in the solid-state imaging device according to the present embodiment include five types of signals, namely, a signal from a first infrared pixel IR (first infrared signal) and a signal from a second infrared pixel IR' (second infrared signal), in addition to a signal from a red pixel (red signal), a signal from a blue pixel (blue signal), and a signal from a green pixel (green signal). Although not clear in FIG. 10, it can be seen that a signal from the first infrared pixel IR is decreased in a wavelength region of 400 to 450 nm due to the addition of C.I. Pigment Red 254. A signal from the second infrared pixel IR' has a spectrum that is sensitive in a wavelength region of 800 nm or more. In this way, two types of infrared light (IR, IR') having different wavelength distributions of light intensities are detectable, which expands the application range for the inspection purpose.

For example, oxyhemoglobin in blood strongly absorbs infrared light in a wavelength region of 800 nm or more, and deoxyhemoglobin strongly absorbs infrared light in a wavelength region of 650 nm to 800 nm. Thus, relative concentration of deoxyhemoglobin and oxyhemoglobin can be measured from a sensitivity ratio of the first infrared pixel IR to the second infrared pixel IR'. In addition, also for the measurement of sugar content and acidity of fruits, sugar content can be measured with high accuracy from a ratio of absorption of infrared light in a wavelength region of 800 nm or more to absorption of infrared light in a wavelength region of 650 nm to 800 nm. Other than these, application of the solid-state imaging device to separate near-infrared rays allows estimation of the taste of rice, nitrogen in the soil, and the like. Thus, an application range of a camera system is considered to be expanded which obtains with ease an infrared spectral image simultaneously with a normal color image.

In addition, the use of the solid-state imaging device according to the present embodiment for a camera module adds an infrared spectroscopic function to a mobile device such as a mobile-phone camera, in addition to the imaging function as a camera module. Thus, not only for a specialist to conduct an analysis, general consumers can check the quality of foodstuffs, and individuals can check the health with ease.

The solid-state imaging device according to the present embodiment receives input signals of five types, namely, a red signal (R), a green signal (G), a blue signal (B), a first infrared signal (IR), and a second infrared signal (IR'), whereas outputs an image using signals of three colors, namely, a red output signal (X), a green output signal (Y), and a blue output signal (Z). Accordingly, a color conversion matrix has three lines and five columns, yet, the idea of a basic color conversion process is the same as that in the first embodiment, and thus a description thereof is omitted here. The color conversion matrix having three lines and five columns can be expressed as shown by Expression 6 below.

[Math 6]

$$\begin{bmatrix} X \\ Y \\ Z \end{bmatrix} = \begin{bmatrix} Ix' & Ix & Rx & Gx & Bx \\ Iy' & Iy & Ry & Gy & By \\ Iz' & Iz & Rz & Gz & Bz \end{bmatrix} \begin{bmatrix} Ir' \\ Ir \\ R \\ G \\ B \end{bmatrix}$$

Expression 6

Furthermore, calculating image signals for pixels allows quantitative evaluation also in this case. For example, in the case of measuring the degree of oxidation in blood as stated earlier, oxyhemoglobin strongly absorbs a wavelength of 800 nm, whereas deoxyhemoglobin strongly absorbs an infrared wavelength of 800 nm or less. Thus, blood oxidation concentration parameter Bsp can be defined based on the ratio of the first infrared signal (IR) to the second infrared signal (IR'), and it can be expressed as Bsp=(IR−kIR')/IR. Here, k is a constant determined from a sensitivity ratio of IR to IR'.

The oxidation degree in blood can be quantitatively evaluated using a numerical value of Bsp. If the amount of oxygen in blood falls below a certain level, symptoms such as light-headedness, dizziness, and a faint occur. Thus, the amount of oxygen in blood can be used as a criterion to determine whether the sick patient is to be transported to an emergency hospital or is to be given first aid to see whether his/her condition improves. In addition, other conceivable usages include measuring with ease the oxygen saturation during exercise, so that the measured oxygen saturation can be used for training and others.

Also in the present embodiment, it is preferable to capture an image with a strobe light, although not essential, in order to further increase the accuracy of measurement (evaluation). The strobe light source used at that time is preferably configured to emit not only visible light, but two types of infrared light having wavelengths corresponding to the sensitivity of two types of infrared pixels. For the configuration described in the present embodiment, the two types of wavelengths are 650 nm to 800 nm and 800 nm to 900 nm. It should be noted that it is not necessary to provide a plurality of light sources if the light source has a wide range of light emission characteristics. For example, if a light source has a wide range of light emission wavelengths from visible to near-infrared light (for example, wavelengths of 400 nm to 1000 nm), a single type of light source is sufficient, and if a light source has a light emission wavelength up to wavelengths of 600 nm to 800 nm, a red light source and an infrared light source (IR light source) can be achieved by the single light source. In addition, if a light source has a light emission wavelength up to a wavelength region of 650 nm to 900 nm, an infrared light source (IR light source) and an infrared light source (IR' light source) can be achieved by the single light source.

[Third Embodiment]

Figure 11A:
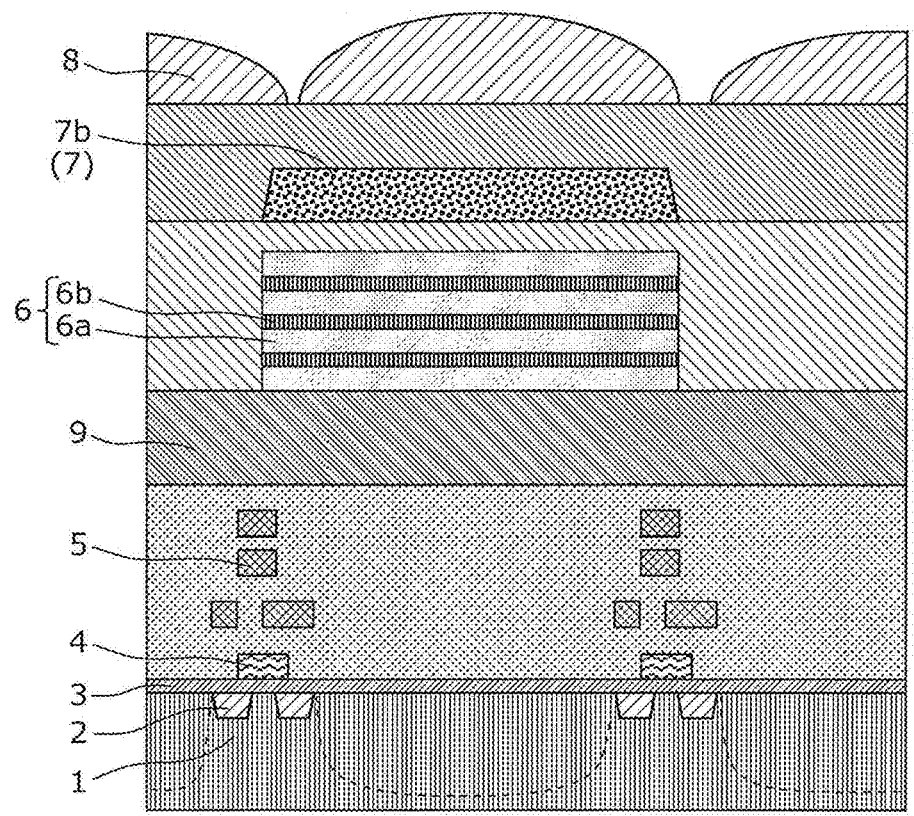
FIG. 11A is a cross-sectional view illustrating a schematic structure of a solid-state imaging device according to a third embodiment.
Figure 11B:
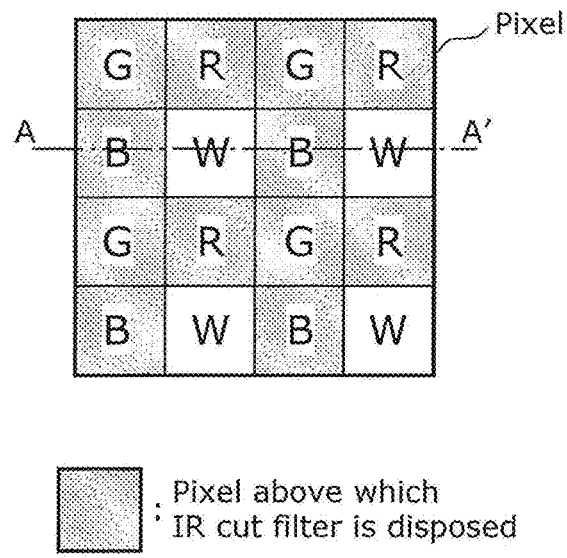
FIG. 11B is a plan view illustrating arrangement of pixels of the solid-state imaging device according to the third embodiment.

FIG. 11A is a cross-sectional view illustrating a schematic structure of a solid-state imaging device according to a third embodiment, and FIG. 11B is a plan view illustrating the layout of pixels of the solid-state imaging device according to the third embodiment. It should be noted that FIG. 11A illustrates a cross-sectional view taken along a portion of the dashed dotted line (line A-A') in FIG. 11B. In addition, the rectangles illustrated in FIG. 11B indicate regions corresponding to the pixels. In FIG. 11B, the symbols "R", "G", and "B" indicate a red pixel, a green pixel, and a blue pixel, respectively, and the symbol "W" indicates a white pixel which detects infrared rays and visible light. In addition, the basic structure of the solid-state imaging device according to the present embodiment is similar to those according to the first and second embodiments, and thus the following briefly describes the differences from the first and second embodiments.

The solid-state imaging device according to the present embodiment is different from the solid-state imaging device according to the first and second embodiments in that an infrared transmission filter 7a is not included. Accordingly, there is no infrared pixel, and the infrared pixels are replaced with white pixels having sensitivity to infrared light and visible light. In order to cause a white pixel to have the same height as those of other visible light pixels, a transparent acrylic polymer pattern is formed in a portion where an infrared transmission filter is formed. A filter of a color filter layer 7 and an infrared cut filter layer 6 are not disposed above a white pixel.

The infrared cut filter layer 6 has a multilayer film structure in which stacks are alternately layered each including a low refractive index layer 6a which includes a low refractive index material and a high refractive index layer 6b which includes a high refractive index material. For the layers, an extremely appropriate semiconducting material for the low refractive index layer 6a is $SiO_2$ widely used, whereas an extremely appropriate high refractive index material for the high refractive index layer 6b is titanium oxide from the viewpoint of a refractive index.

However, if conformity with a semiconductor process is taken into consideration, there are many advantages of using SiN and SiON. This is because processing is easy, and a special device and special gas are not required for manufacturing films. However, a stoichiometric silicon nitride film ($Si_4N_3$) has a refractive index of about 2.0 at a wavelength of 633 nm, and if $Si_4N_3$ is combined with $SiO_2$, sufficient characteristics as the infrared cut filter layer 6 are not obtained.

Figure 12:
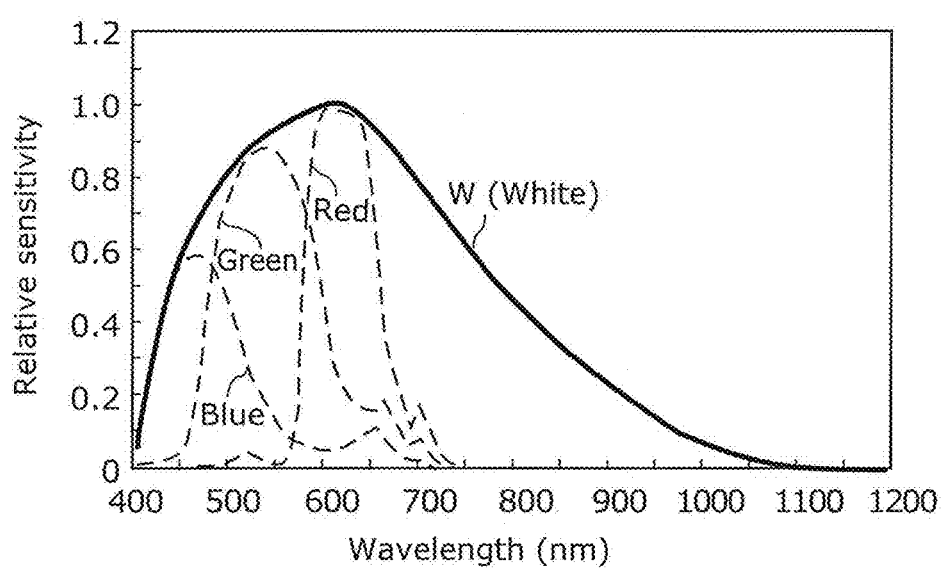
FIG. 12 illustrates spectral sensitivity characteristics of the solid-state imaging device according to the third embodiment.

FIG. 12 illustrates spectral sensitivity characteristics of the solid-state imaging device according to the third embodiment. It should be noted that in FIG. 12, spectral sensitivity of white pixel W (W in FIG. 12) is indicated by a thick solid line, and dashed lines indicate spectral sensitivity of visible light pixels, namely, a red pixel (red in FIG. 12), a blue pixel (blue in FIG. 12), and a green pixel (green in FIG. 12).

As illustrated in FIG. 12, a white pixel W has sensitivity to visible light up to an infrared region. Thus, the solid-state imaging device according to the present embodiment which includes white pixels W has an extremely high sensitivity, and is applicable to, for instance, a monitoring usage and an on-vehicle usage that require sensitivity in the dark.

The solid-state imaging device according to the present embodiment has another difference from the solid-state imaging device according to the first and second embodiments. The difference is that an ultraviolet light absorption film (ultraviolet light cut filter layer) 9 is added between the infrared cut filter layer 6 and wiring layers 5. The following describes the reason therefor.

According to the solid-state imaging device according to the present embodiment, the infrared cut filter layer 6 is disposed inside the solid-state imaging device, thus expanding an imageable and measurable wavelength range to an infrared light area. Accordingly, if the solid-state imaging device according to the present embodiment is used for a camera module (camera system), an infrared cut filter disposed outside the solid-state imaging device and required for a typical imaging system can be omitted, which is an advantage. It should be noted that in practice, an infrared and ultraviolet cut filter (UV/IR cut filter) which does not transmit ultraviolet light in addition to infrared light is typically used for an infrared cut filter used for a typical camera system. Accordingly, to more faithfully reproduce colors, although an infrared and ultraviolet cut filter is unnecessary, a new ultraviolet light cut filter is necessary, which prevent obtaining advantages such as a reduction in the cost and size of a camera system. In order to solve this problem, the solid-state imaging device according to the present embodiment includes an ultraviolet light cut filter stacked as the ultraviolet light absorption film 9.

The ultraviolet light absorption film 9 includes a silicon nitride film having a thickness of 0.5 micron or more, for example, and is formed so as to cover the whole of a plurality of light receiving portions, and blocks ultraviolet light. The ultraviolet light absorption film 9 can be formed by depositing 1000 nm of a silicon nitride (SiN) film by low pressure chemical vapor deposition (CVD), for example. The SiN film formed by low pressure CVD absorbs light having a short wavelength of 420 nm or less, and thus can be used as the ultraviolet light absorption film 9.

Comparing spectral sensitivity characteristics illustrated in FIG. 12 with spectral sensitivity characteristics of the solid-state imaging device having a structure without the ultraviolet light absorption film 9 as illustrated in FIGS. 5 and 10, it can be seen that sensitivity at a wavelength of 400 nm to 420 nm is decreased, and the influence of ultraviolet light is reduced. The ultraviolet light absorption film 9 is applicable not only to the solid-state imaging device according to the present embodiment, but to the solid-state imaging device according to the first and second embodiments, achieving similar effects.

In addition, although a SiN film is used as the ultraviolet light absorption film 9 for the solid-state imaging device according to the present embodiment, the ultraviolet light absorption film is not limited to this, and another inorganic or organic film can be used if the film absorbs light having a wavelength of 450 nm or less. For example, a TiN film, a TiO$_2$ film, a styrene resin, a novolac resin, or the like can be used.

In addition, although the solid-state imaging device according to the present embodiment has a configuration in which the ultraviolet light absorption film 9 is layered above all the pixels so that all the pixels are covered with the ultraviolet light absorption film 9, the solid-state imaging device according to the present embodiment may have a configuration in which the ultraviolet light absorption film 9 is layered only on blue pixels so that only the blue pixels is covered with the ultraviolet light absorption film 9, since only blue pixels actually have problems due to incidence of ultraviolet light.

It should be noted that it is also possible to give a function of absorbing ultraviolet rays to color filters of the color filter layer 7 by adding ultraviolet absorption pigments to blue color filters, rather than the ultraviolet light absorption film 9 is separately provided.

In addition, a SiON film is used as the ultraviolet light absorption film 9, and a composition ratio of silicon, oxygen, and nitrogen is changed, thus controlling the absorption and thickness of the ultraviolet light absorption film 9. The ultraviolet light absorption film 9 preferably has optical characteristics according to which transmittance of light having a wavelength of 400 nm is 30% or less, and a transmittance of light having a wavelength of 450 nm is 70% or more. Furthermore, the ultraviolet light absorption film 9 more preferably has optical characteristics according to which transmittance of light having a wavelength of 400 nm is 15% or less, and transmittance of light having a wavelength of 450 nm is 85% or more. To form the ultraviolet light absorption film 9, a mixed gas of nitrogen, silane, and ammonia is used to form a SiN film by low pressure CVD. Characteristics of the ultraviolet light absorption film 9 absorbing ultraviolet light can be changed by changing the gas ratio of this mixed gas, and the gas ratio and the thickness which satisfy the conditions above can be set.

The following describes signal processing by the solid-state imaging device according to the present embodiment.

As with the first embodiment, RGB of a color image captured in an imaging scene bright enough may be output as they are. On the other hand, in a dark imaging scene, an image is displayed in black and white focusing on signals from white pixels W. A color conversion matrix shown by Expression 7 below is used for signal processing in this case.

[Math 7]

$$\begin{bmatrix} X \\ Y \\ Z \end{bmatrix} = \begin{bmatrix} 1 & 1 & 1 & 1 \\ 1 & 1 & 1 & 1 \\ 1 & 1 & 1 & 1 \end{bmatrix} \begin{bmatrix} W \\ R \\ G \\ B \end{bmatrix} \quad \text{Expression 7}$$

The solid-state imaging device outputs, to a display, an output signal (output image) which includes all of RGB. RGB displayed on the display have the same values, thus resulting in black and white (gray) display. When signal processing is performed, the brightness of a scene is determined, and when the brightness is a threshold or less, the display is switched to the above gray display. Even if the resolution of a scene falls which has certain brightness or less, image processing which gives priority to luminance is effectively performed. If such processing is performed inside the solid-state imaging device, and the result is output to the outside, a monitoring system for both day and night can be achieved, using the existing image signal processing system.

[Fourth Embodiment]

Figure 13A:
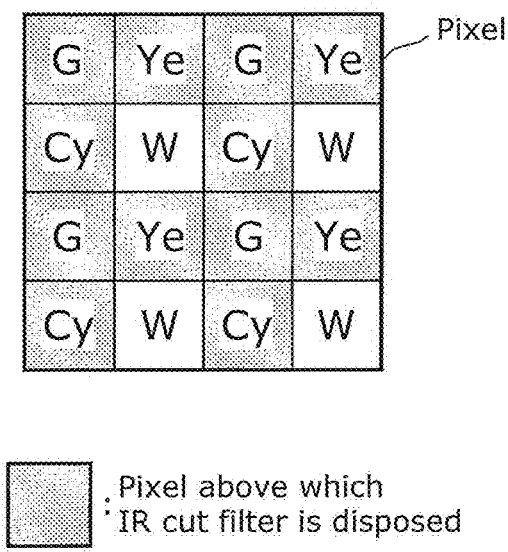
FIG. 13A is a plan view illustrating arrangement of pixels of a solid-state imaging device according to a fourth embodiment.
Figure 13B:
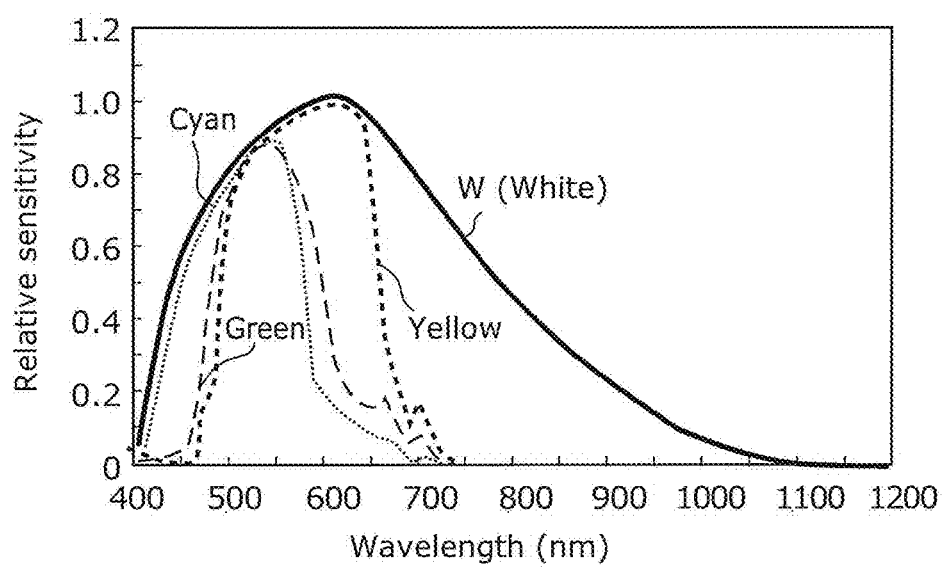
FIG. 13B illustrates spectral sensitivity characteristics of the solid-state imaging device according to the fourth embodiment.

FIG. 13A is a plan view illustrating the layout of pixels of a solid-state imaging device according to a fourth embodiment. FIG. 13B illustrates spectral sensitivity characteristics of the solid-state imaging device according to the fourth embodiment. It should be noted that the rectangles illustrated in FIG. 13A indicate regions corresponding to pixels. In FIG. 13A, the symbols "Cy", "G", and "Ye" indicate a cyan pixel, a green pixel, and a yellow pixel, respectively, and the symbol "W" indicates a white pixel which detects infrared rays and visible light. In addition, in FIG. 13B, spectral sensitivity of a white pixel W (W in FIG. 13B) is indicated by a thick solid line, spectral sensitivity of a cyan pixel (cyan in FIG. 13B) which is a visible light pixel is indicated by a thin dotted line, spectral sensitivity of a green pixel (green in FIG. 13B) which is a visible light pixel is indicated by a dashed line, and spectral sensitivity of a yellow pixel (yellow in FIG. 13B) which is a visible light pixel is indicated by a thick dotted line. In addition, the basic structure of the solid-state imaging device according to the present embodiment is similar to those according to the first to third embodiments, and thus the following briefly describes differences from the first to third embodiments.

The solid-state imaging device according to the present embodiment is different from the solid-state imaging device according to the first to third embodiments in that complementary color filters are used as color filters of the color filter layer 7. The use of complementary color filters improves a usage rate of incident light. This is because while the complementary colors, namely, yellow, cyan, and magenta are a combination of green and red, a combination of blue and green, and a combination of blue and red, respectively, only one third of incident white light (a combination of blue, green, and red) is used when pixels which receive the primary colors, namely, blue, red, and green are used, whereas the use of the complementary color filters allows two thirds of light to be used.

The solid-state imaging device according to the present embodiment includes the color filter layer 7 which includes cyan color filters, yellow color filters, green color filters, and white color filters. A method for manufacturing the solid-state imaging device according to the present embodiment is similar to the first to third embodiments, and the only difference is the color filter material used for the color filter layer 7. Commercial color filter resist materials can be used for all the complementary color materials included in the color filter layer 7 according to the present embodiment.

A plurality of light receiving portions of the solid-state imaging device include four light receiving portions adjacently arranged in a 2×2 matrix, and the color filter layer 7 above the four light receiving portions includes four visible light transmission filters, namely, a cyan color filter, a yellow color filter, a green color filter, and a white color filter. An infrared cut filter layer has an opening above a light receiving portion above which a white color filter is formed.

FIG. 13B shows a great improvement in sensitivity of a solid-state imaging device to visible light. Also in the solid-state imaging device according to the present embodiment, an infrared cut filter is not formed above the portion of a white pixel W, and thus the white pixel W has sensitivity to visible light and infrared light. In particular, if white pixels W are used, there is a problem that white pixels W are saturated first, and the range of brightness (dynamic range) for capturing a normal image narrows, due to a considerable difference in sensitivity between a white pixel W and other visible light pixels. Yet, the use of complementary color filters in the color filter layer 7 brings advantages in not only improving sensitivity, but expanding the dynamic range.

In the solid-state imaging device according to the present embodiment, as complementary color filters of the color filter layer 7, yellow, green, and cyan filters are intentionally used, rather than yellow, magenta, and cyan filters which are three basic complementary colors. This is because the study of image signal processing has brought a result that color reproducibility can be improved by using green rather than magenta that is a complementary color. This is due to insufficient characteristics of a magenta color filter currently available (a transmittance of blue light is low, and a transmittance of green light is high), which lowers color performance. In addition, silicon has sensitivity to light having a wavelength of about 500 nm, and thus a fall of sensitivity can be inhibited even if green is used. Accordingly, if a magenta color filter exhibiting high performance can be used, it is also possible to achieve a solid-state imaging device having a configuration with yellow, magenta, cyan, and white color filters.

[Fifth Embodiment]

Figure 14A:
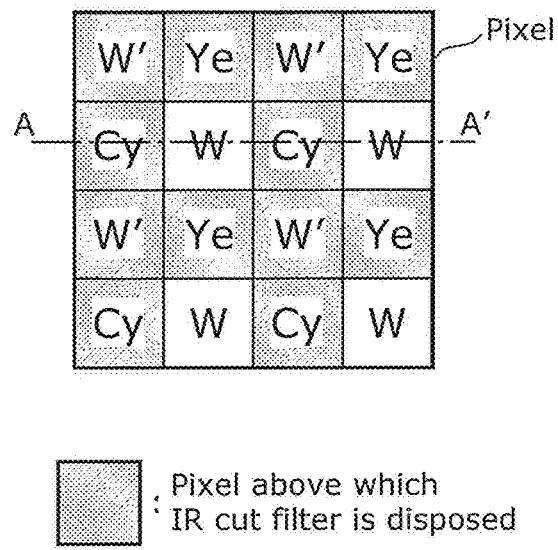
FIG. 14A is a plan view illustrating arrangement of pixels of a solid-state imaging device according to a fifth embodiment.
Figure 14B:
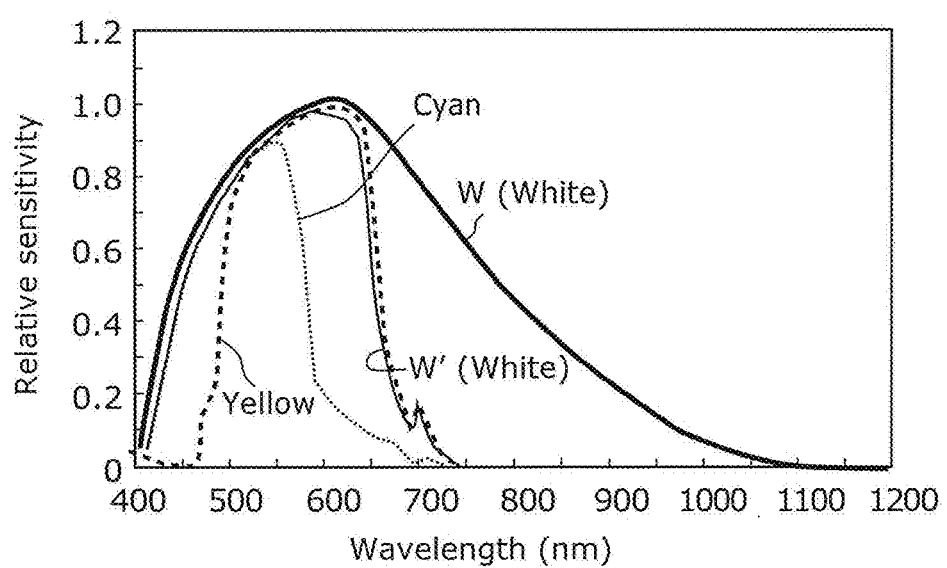
FIG. 14B illustrates spectral sensitivity characteristics of the solid-state imaging device according to the fifth embodiment.

FIG. 14A is a plan view illustrating the layout of pixels of a solid-state imaging device according to a fifth embodiment. FIG. 14B illustrates spectral sensitivity characteristics obtained by the solid-state imaging device according to the fifth embodiment. It should be noted that the rectangles illustrated in FIG. 14A represent regions corresponding to pixels. In addition, in FIG. 14A, the symbols "Cy" and "Ye" indicate a cyan pixel and a yellow pixel, respectively, and the symbol "W'" indicates a white pixel which detects visible light and does not detect infrared rays, and the symbol "W" indicates a white pixel which detects infrared rays and visible light. In addition, in FIG. 14B, spectral sensitivity of a white pixel W (W in FIG. 14B) is indicated by a thick solid line, and spectral sensitivity of a white pixel W' (W' in FIG. 14B) is indicated by a thin solid line, spectral sensitivity of a cyan pixel that is a visible light pixel (cyan in FIG. 14B) is indicated by a thin dotted line, and spectral sensitivity of a yellow pixel that is a visible light pixel (yellow in FIG. 14B) is indicated by a thick dotted line. In addition, a basic structure of the solid-state imaging device according to the present embodiment is similar to those according to the first to third embodiments, and thus the following briefly describes differences from the first to third embodiments.

The solid-state imaging device according to the present embodiment is different from the solid-state imaging device according to the first to third embodiments in that complementary color filters are used for the color filters of the color filter layer 7. The use of complementary color filters improves a usage rate of incident light, and increases sensitivity.

A plurality of light receiving portions of the solid-state imaging device include four light receiving portions adjacently disposed in a 2×2 matrix, and a color filter layer disposed above the four light receiving portions includes three visible light transmission filters, namely, a cyan color filter, a yellow color filter, and a white color filter. White color filters are formed in the color filter layer above two of the four light receiving portions. An infrared cut filter layer is formed above one of the two light receiving portions above which the white color filters are formed, and has an opening above the other one the two light receiving portions above which the white color filters are formed.

The solid-state imaging device according to the present embodiment includes a color filter layer 7 which includes a cyan color filter formed above a cyan pixel, a yellow color filter formed above a yellow pixel, and a white color filter formed above a white pixel W.

Infrared cut filters are formed above a cyan pixel, a yellow pixel, and a white pixel W', and infrared cut filters are not formed above the remaining white pixels W. Accordingly, the solid-state imaging device according to the present embodiment has spectral sensitivity characteristics as illustrated in FIG. 14B. The output from four pixels, namely, a cyan pixel, a yellow pixel, and white pixels W' and W has four colors, that is, cyan from the cyan pixel, yellow from the yellow pixel, white from the white pixel W' (W' is a combination of red, green, and blue), and a combination of white and infrared rays from the white pixel W (W is a combination of red, green, blue, and infrared rays). In color signal processing, although details are omitted here, white and infrared (W') are used to create a luminance signal, and three colors, namely, cyan, yellow, and white (W') are used for color calculation. This configuration achieves an extremely highly sensitive solid-state imaging device which can give color display.

As described above, a solid-state imaging device which uses an infrared signal may have various pixel configurations. A pixel configuration is selected according to a usage.

If infrared light is used for an inspection usage, separation of a spectrum is extremely important, and thus a four-color pixel configuration having a blue pixel, a green pixel, a red pixel, and an infrared pixel IR is preferable. In contrast, for a usage for which a greater importance is attached to sensitivity, a pixel configuration in which a white pixel and a complementary color filter are utilized is preferable in order to achieve higher light use efficiency. In this case, sensitivity and color faithfulness are in a trade-off relation, and thus it is necessary to appropriately determine a pixel configuration according to the performance required in the applicable field.

The descending order of color performance is as follows: blue, green, red, and IR; blue, green, red, and infrared containing white; cyan, green, yellow, and infrared containing white; and cyan, yellow, white, and infrared containing white. The arrangement of pixels can be selected according to necessary color performance and sensitivity.

[Sixth Embodiment]

Figure 15:
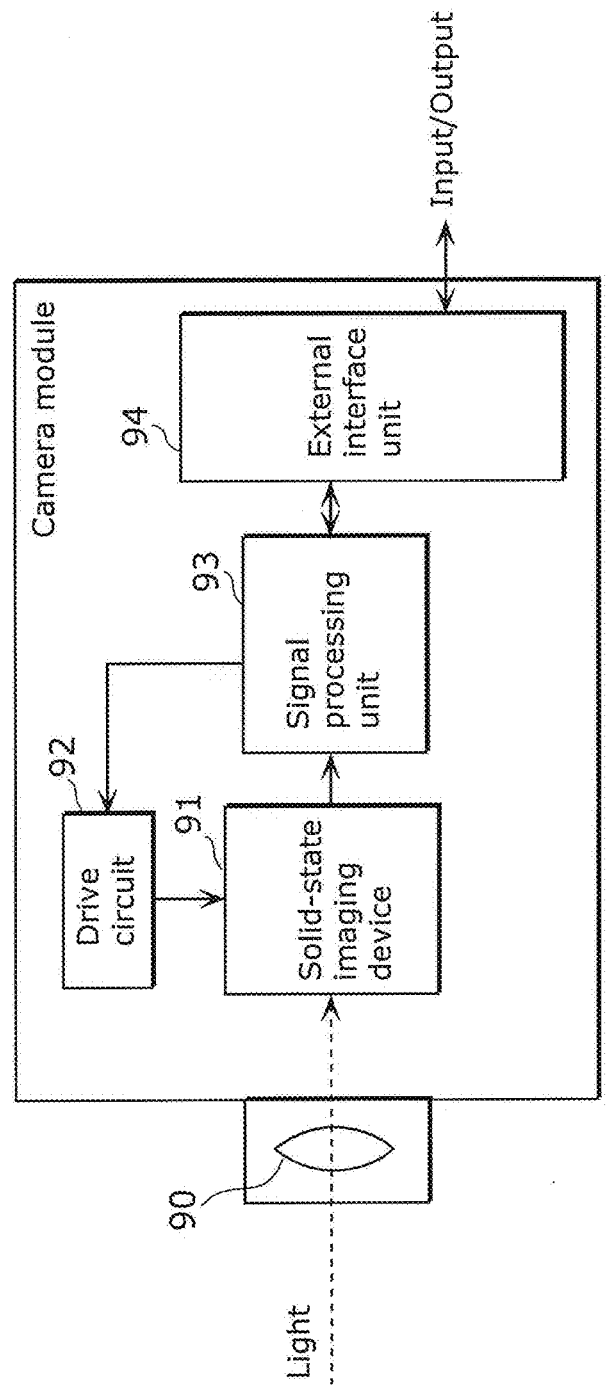
FIG. 15 is a block diagram of a camera module according to a sixth embodiment.

FIG. 15 is a block diagram of a camera module according to a sixth embodiment.

This camera module includes a lens 90, a solid-state imaging device 91 which is the device according to one of the first to fifth embodiments, a drive circuit 92, a signal processing unit (signal processing circuit) 93, and an external interface unit 94.

In the camera module having the above configuration, processing until the output of a signal to the outside is performed in accordance with the following order.

(1) Light passes through the lens 90 and enters the solid-state imaging device 91.

(2) The signal processing unit 93 drives the solid-state imaging device 91 via the drive circuit 92, and takes in an output signal from the solid-state imaging device 91.

(3) A signal processed by the signal processing unit 93 is output to the outside via the external interface unit 94.

The signal processing unit 93 receives, from the solid-state imaging device 91 as an output signal, at least one of: a set which includes a red signal, a green signal, a blue signal, and an infrared signal; a set which includes a red signal, a green signal, a blue signal, and an infrared-containing white signal; a set which includes a cyan signal, a yellow signal, a green signal, and an infrared-containing white signal; a set which includes a cyan signal, a yellow signal, and an infrared-containing white signal; or a set which includes a red signal, a green signal, a blue signal, a first infrared signal, and a second infrared signal. Next, the signal processing unit 93 performs calculation for converting the received at least one set into a set which includes a red signal, a green signal, and a blue signal, and outputs the converted set of signals to the outside through the external interface unit 94.

It should be noted that the camera module according to the present embodiment may include a lighting apparatus which can emit infrared light simultaneously with visible light, as an illumination light source of the solid-state imaging device 91.

In addition, in the camera module according to the present embodiment, the signal processing unit 93 may be formed as a semiconductor LSI element on a chip different from that for the solid-state imaging device 91, or may be formed on the same chip.

In addition, in the camera module according to the present embodiment, the solid-state imaging device 91 may convert a signal, instead of the signal processing unit 93. In this case, the solid-state imaging device 91 includes a signal processing circuit which obtains, through a plurality of light receiving portions, at least one of: a set which includes a red signal, a green signal, a blue signal, and an infrared signal; a set which includes a red signal, a green signal, a blue signal, and an infrared-containing white signal; a set which includes a cyan signal, a yellow signal, a green signal, and an infrared-containing white signal; a set which includes a cyan signal, a yellow signal, and an infrared-containing white signal; or a set which includes a red signal, a green signal, a blue signal, a first infrared signal, and a second infrared signal, and performs calculation for converting the obtained at least one set into a set which includes a red signal, a green signal, and a blue signal.

Although the above describes the solid-state imaging device and the camera module according to the present invention, based on the embodiments, the present invention is not limited to such embodiments. The scope of the present invention includes various modifications to the embodiments, which may be conceived by those skilled in the art, within a scope which does not depart from the essence of the present invention. Furthermore, the constituent elements in the embodiments may be arbitrarily combined without departing from the essence of the present invention.

For example, although a multilayer film which includes nine layers of $TiO_2$ and $SiO_2$ illustrated in FIG. 4A is shown as an example of the infrared cut filter layer 6 in the above embodiments, the structure of the infrared cut filter layer 6 is not limited to this. In general, there is a problem that a manufacturing process becomes complicated, and the yield falls, although an increase in the number of layers achieves better optical characteristics. Accordingly, it is necessary to design the configuration of the infrared cut filter layer 6 appropriately according to the number of layers and material.

Figures 16A, 16B:
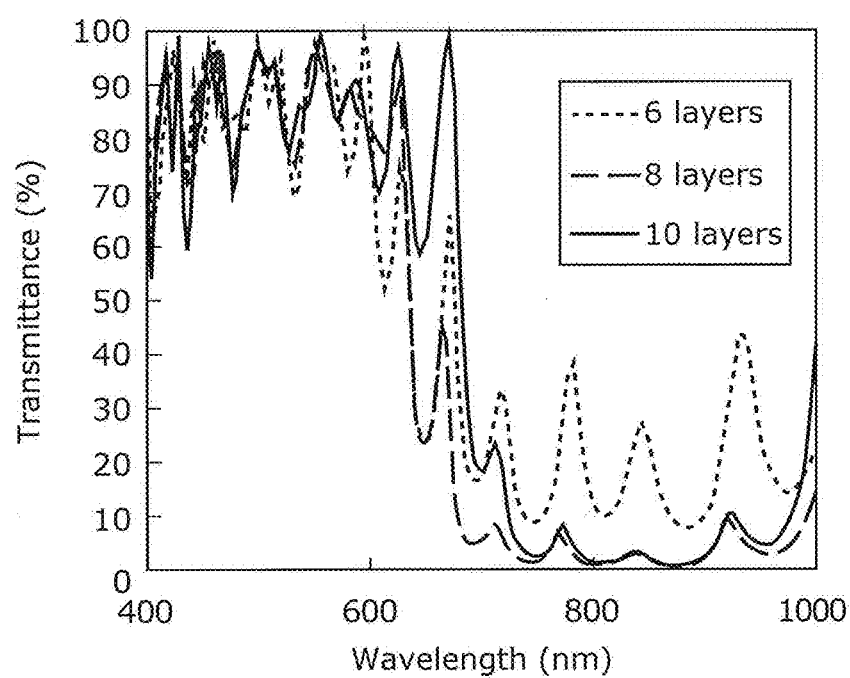
FIG. 16A illustrates configurations of variations of an infrared cut filter layer according to an embodiment.
FIG. 16B illustrates transmittance characteristics of the variations of the infrared cut filter layer according to the embodiment.

FIG. 16A illustrates the structure of the infrared cut filter layer 6 having a structure which includes $TiO_2$ and $SiO_2$ when a total number of layers is changed (if the total numbers of layers are 6, 8, and 10). FIG. 16B illustrates characteristics of transmittance of the infrared cut filter layer 6 having the structure in FIG. 16A.

FIGS. 16A and 16B show that the contrast between a transmission region and a light blocking region is increased with an increase in the number of layers, resulting in a steep change in transmittance.

In the above embodiments, the infrared cut wavelength at which the transmittance of the infrared cut filter layer 6 is 50% and the infrared transmission wavelength at which the transmittance of an infrared transmission filter 7a is 50% are both designed to be 650 nm. As already stated, although this design is highly preferable, such values may vary due to restrictions on the material of the infrared transmission filter 7a and a change in manufacture of the infrared cut filter layer 6. As the range of allowable optical characteristics, it is preferable that the infrared cut wavelength at which the transmittance of the infrared cut filter layer 6 is 50% or less (in particular, 50%) ranges from 610 nm to 710 nm, whereas the infrared transmission wavelength at which the transmittance of the infrared transmission filter 7a is 50% or more (in particular, 50%) ranges from 590 nm to 690 nm. It is particularly preferable that the infrared cut wavelength at which the transmittance of the infrared cut filter layer 6 is 50% or less (in particular, 50%) ranges from 630 nm to 690 nm, whereas the infrared transmission wavelength at which the transmittance of the infrared transmission filter 7a is 50% or more (in particular, 50%) ranges from 610 nm to 670 nm. If the infrared cut wavelength of the infrared cut filter layer 6 deviates from this range, the solid-state imaging device cannot give sufficient performance, which leads to deterioration of color reproducibility of a color picture. A decrease in a red saturation range is remarkable, in particular. If the infrared transmission wavelength of the infrared transmission filter 7a exceeds 670 nm, IR sensitivity falls by more than 10%. On the other hand, if the infrared transmission wavelength is shorter than 610 nm, an overlap with a red pixel is large, and the spectra of red light and infrared light are insufficiently separated. Thus, the accuracy of evaluation and measurement using infrared light will decrease. Accordingly, when the solid-state imaging device according to the above embodiments is to be manufactured, it is particularly important to manage the designs and manufacturing processes of the infrared cut filter layer 6 and the infrared transmission filter 7a, in order to achieve the above optical characteristics including variations.

In the above embodiments, the infrared cut filter layer 6 is a stack structure of a low refractive index layer 6a which includes a low refractive index material, and a high refractive index layer 6b which includes a high refractive index material. For the layers, it is extremely appropriate to use $SiO_2$ that is widely used as a semiconducting material for the low refractive index layer 6a, whereas it is extremely appropriate to use titanium oxide for the high refractive index layer 6b which includes a high refractive index material from the viewpoint of a refractive index. However, using SiN and SiON for the high refractive index layer 6b brings many advantages in view of conformity with the semiconductor process. This is because processing is easy, and a special device and gas are not required for forming films. A stoichiometric silicon nitride film ($Si_4N_3$) has a refractive index of about 2.0 at a wavelength of 633 nm, and a combination of the film and $SiO_2$ does not achieve characteristics sufficient as the infrared cut filter layer 6.

If SiN or SiON is used as a high refractive index material of the high refractive index layer 6b, it is necessary to form a film using a high refractive index material under conditions that a refractive index is increased. A silicon nitride film is formed so as to be more silicon rich, thus increasing a refractive index of SiN. Specifically, under a condition that in a sputtering apparatus in which a target is silicon, a film is formed while a partial pressure of nitrogen gas is lowered, and power is increased, a refractive index of SiN is increased. As already stated, if a refractive index is 2.2 or less, a transmittance of visible light of the infrared cut filter layer 6 increases up to about 20%, which is insufficient as satisfactory characteristics of the infrared cut filter layer 6. On the other hand, under the condition that a refractive index is 2.4 or more, the absorption of light having a wavelength of 500 nm or less is increased and thus it is difficult to use SiN as a color sensor. Controlling conditions for forming films allows a refractive index at a wavelength of 633 nm to be adjusted in a range from 2.2 to 2.4, thus forming a favorable infrared cut filter layer 6.

In addition, although the solid-state imaging device is formed using a complementary metal-oxide semiconductor (CMOS) image sensor in the above embodiments, the present invention is not limited to this, and it is needless to say that similar performance can be achieved by using any image sensor including a charge-coupled device (CCD) image sensor.

INDUSTRIAL APPLICABILITY

The present invention is applicable for a solid-state imaging device used in mobile devices such as a digital camera, a mobile phone, and others, for example.

REFERENCE SIGNS LIST

1 Semiconductor substrate
2 Element isolation
3 Insulating film
4 Gate
5 Wiring layer
6 Infrared cut filter layer
6a Low refractive index layer
6b High refractive index layer
7 Color filter layer
7a Infrared transmission filter
7b Blue color filter
7d Red color filter
8 Micro lens
9 Ultraviolet light absorption film
90 Lens
91 Solid-state imaging device
92 Drive circuit
93 Signal processing unit
94 External interface unit

The invention claimed is:

1. A solid-state imaging device comprising:
a substrate having light receiving portions;
a color filter layer which includes filters disposed above the light receiving portions in one-to-one correspondence; and
an infrared cut filter layer having an infrared cut wavelength at which transmittance is 50% and which is within a range from 610 nm to 710 nm,
wherein the filters include a visible light transmission filter which transmits visible light, and an infrared transmission filter having an infrared transmission wavelength at which transmittance is 50% and which is within a range from 590 nm to 690 nm,
the infrared cut filter layer is disposed above one of the light receiving portions above which the visible light transmission filter is disposed, and has an opening above one of the light receiving portions above which the infrared transmission filter is disposed,
the infrared cut filter layer has transmittance of 50% or less for light in a wavelength range from the infrared cut wavelength to 1000 nm, and
the infrared transmission filter has transmittance of 50% or more for light in a wavelength range from the infrared transmission wavelength to 1100 nm.

2. The solid-state imaging device according to claim 1, wherein the light receiving portions include four light receiving portions adjacently arranged in a 2×2 matrix, and the color filter layer includes, above the four light receiving portions, four of the filters which are the infrared transmission filter, and three of the visible light transmission filters including a red color filter, a green color filter, and a blue color filter.

3. The solid-state imaging device according to claim 1,
wherein the light receiving portions include eight light receiving portions adjacently arranged in a 4×2 matrix,
the eight light receiving portions include two sets of four light receiving portions adjacently arranged in a 2×2 matrix,
the color filter layer includes, above each of the two sets of the four light receiving portions, four of the filters which are the infrared transmission filter, and three of the visible light transmission filters, and
the infrared transmission filters above the two sets of the four light receiving portions included in the eight light receiving portions have different infrared light transmittance characteristics.

4. The solid-state imaging device according to claim 1,
wherein the infrared transmission filter includes a color filter material which contains a purple pigment and a yellow pigment as main components.

5. The solid-state imaging device according to claim 1,
wherein the infrared cut filter layer includes a multilayer film which is a stack of a layer which includes a silicon oxide film and a layer which includes a titanium oxide film.

6. The solid-state imaging device according to claim 1,
wherein the infrared cut filter layer includes a multilayer film which is a stack of a layer which includes a silicon oxide film and a layer which includes a silicon-rich silicon nitride film.

7. A camera module comprising
the solid-state imaging device according to claim 1.

8. The camera module according to claim 7, further comprising a lighting device which emits infrared light simultaneously with visible light.

9. The camera module according to claim 7,
wherein the solid-state imaging device includes a signal processing circuit which obtains, through the light receiving portions, at least one of:
a set which includes a red signal, a green signal, a blue signal, and an infrared signal;
a set which includes a red signal, a green signal, a blue signal, and an infrared-containing white signal;
a set which includes a cyan signal, a yellow signal, a green signal, and an infrared-containing white signal;
a set which includes a cyan signal, a yellow signal, and an infrared-containing white signal; or
a set which includes a red signal, a green signal, a blue signal, a first infrared signal, and a second infrared signal, and
converts the obtained at least one set into a set which includes a red signal, a green signal, and a blue signal.

10. The camera module according to claim 7, further comprising a signal processing circuit which receives, from the solid-state imaging device, at least one of:
a set which includes a red signal, a green signal, a blue signal, and an infrared signal;
a set which includes a red signal, a green signal, a blue signal, and an infrared-containing white signal;
a set which includes a cyan signal, a yellow signal, a green signal, and an infrared-containing white signal;
a set which includes a cyan signal, a yellow signal, and an infrared-containing white signal; or
a set which includes a red signal, a green signal, a blue signal, a first infrared signal, and a second infrared signal, and
converts the received at least one set into a set which includes a red signal, a green signal, and a blue signal.

* * * * *